(12) United States Patent
Nakamura et al.

(10) Patent No.: US 8,572,430 B2
(45) Date of Patent: Oct. 29, 2013

(54) STORAGE APPARATUS AND METHOD OF COOLING STORAGE APPARATUS

(75) Inventors: Toshikatsu Nakamura, Odawara (JP);
Mitsuhide Sato, Odawara (JP);
Nobuhiro Yokoyama, Odawara (JP)

(73) Assignee: Hitachi, Ltd., Tokyo (JP)

( * ) Notice: Subject to any disclaimer, the term of this patent is extended or adjusted under 35 U.S.C. 154(b) by 117 days.

(21) Appl. No.: 13/381,041

(22) PCT Filed: Nov. 24, 2011

(86) PCT No.: PCT/JP2011/006533
§ 371 (c)(1),
(2), (4) Date: Dec. 27, 2011

(87) PCT Pub. No.: WO2013/076767
PCT Pub. Date: May 30, 2013

(65) Prior Publication Data
US 2013/0139000 A1    May 30, 2013

(51) Int. Cl.
*G06F 11/00*    (2006.01)
(52) U.S. Cl.
USPC ...................................... 714/6.3; 361/679.33
(58) Field of Classification Search
USPC ................................................... 361/679.33
See application file for complete search history.

(56) References Cited

U.S. PATENT DOCUMENTS

| | | | |
|---|---|---|---|
| 5,414,591 A | | 5/1995 | Kimura et al. |
| 6,011,689 A | * | 1/2000 | Wrycraft ........................ 361/695 |
| 2004/0158771 A1 | * | 8/2004 | Garnett et al. .................. 714/14 |
| 2007/0293137 A1 | | 12/2007 | Crippen et al. |
| 2008/0144277 A1 | | 6/2008 | Suzuki et al. |
| 2012/0113582 A1 | * | 5/2012 | Hirano et al. ............. 361/679.33 |
| 2012/0281350 A1 | * | 11/2012 | Tanaka et al. ............. 361/679.33 |

FOREIGN PATENT DOCUMENTS

EP    1975940 A2    10/2008

OTHER PUBLICATIONS

International Search Report and Written Opinion on international application No. PCT/JP2011/006533.

* cited by examiner

*Primary Examiner* — James Kramer
*Assistant Examiner* — Neil Miles
(74) *Attorney, Agent, or Firm* — Volpe and Koenig, P.C.

(57) ABSTRACT

Provided is a storage apparatus for providing a logical storage area as a data storage area to an external apparatus, comprising: a physical storage medium for creating the logical storage area; first and second storage control modules each of which is communicatively coupled to the physical storage medium to control data input/output processing between the external apparatus and the logical storage area; and first and second power supply modules each of which supplies power to the physical storage medium and the first and second storage control modules and includes a blower for generating a cooling airflow to cool down the physical storage medium and the first and second storage control modules, wherein the blower of the first power supply module generates a first cooling airflow which flows through the physical storage medium, the first storage control module, and the first power supply module, the blower of the second power supply module generates a second cooling airflow which flows through the physical storage medium, the second storage control module, and the second power supply module, and in a case where the first power supply module is removed from the storage apparatus, the blower of the second power supply module generates a third cooling airflow which flows through the physical storage medium, the first storage control module, and the second power supply module as a replacement for the first cooling airflow.

11 Claims, 32 Drawing Sheets

VIEW ON ARROW III-III

Fig. 9

RAID GROUP MANAGEMENT TABLE 1150

| RG NO. | RAID LEVEL | START HDD POSITION | | LAST HDD POSITION | | NO. OF COMPONENTS | USER'S AVAILABLE AREA |
|---|---|---|---|---|---|---|---|
| | | CHASSIS NO. | HDD POSITION | CHASSIS NO. | HDD POSITION | | |
| 0 | 5 | 0 | 0 | 0 | 5 | 6 | 500GB |
| 1 | 6 | 0 | 6 | 0 | 13 | 8 | 750GB |
| 2 | 0 | 0 | 14 | 0 | 15 | 2 | 100GB |
| ... | ... | ... | ... | ... | ... | ... | ... |

Fig. 10

LOGICAL VOLUME MANAGEMENT TABLE 1160

| LU NO. | RG NO. OF LU LOCATION | USED CAPACITY | STARTING POSITION WITHIN RG | OWNER CONTROLLER INFORMATION ||| 
| --- | --- | --- | --- | --- | --- | --- |
| | | | | NORMAL OPERATION TIME | PS0 ABNORMAL TIME | PS1 ABNORMAL TIME |
| 0 | 0 | 100GB | 00010 | CTL0 | CTL1 | CTL0 |
| 1 | 0 | 150GB | 10000 | CTL1 | CTL1 | CTL0 |
| 2 | 1 | 200GB | 00001 | CTL1 | CTL1 | CTL0 |
| ... | ... | ... | ... | ... | ... | ... |

Fig. 11A

DEVICE MANAGEMENT TABLE 1130

| DEVICE | LOCATION | NORMAL TIME OWNER CONTROLLER | CTL0 ABNORMAL TIME OWNER CONTROLLER |
|---|---|---|---|
| POWER UNIT | PS0 | CTL0 | CTL1 |
| COOLING FAN | PS0 | CTL0 | CTL1 |
| BATTERY | PS0 | CTL0 | CTL1 |
| POWER UNIT | PS1 | CTL0 | CTL1 |
| COOLING FAN | PS1 | CTL0 | CTL1 |
| BATTERY | PS1 | CTL0 | CTL1 |
| ... | ... | ... | ... |

DEVICE MANAGEMENT TABLE 1130

| DEVICE | LOCATION | NORMAL TIME OWNER CONTROLLER | CTL0 ABNORMAL TIME OWNER CONTROLLER | CTL1 ABNORMAL TIME OWNER CONTROLLER |
|---|---|---|---|---|
| POWER UNIT | PS0 | CTL0 | CTL1 | CTL0 |
| COOLING FAN | PS0 | CTL0 | CTL1 | CTL0 |
| BATTERY | PS0 | CTL0 | CTL1 | CTL0 |
| POWER UNIT | PS1 | CTL1 | CTL1 | CTL0 |
| COOLING FAN | PS1 | CTL1 | CTL1 | CTL0 |
| BATTERY | PS1 | | | |
| ⋮ | ⋮ | ⋮ | ⋮ | ⋮ |

Fig. 12

VENT SHUTTER CONTROL MANAGEMENT TABLE 1140

| VENT SHUTTER ID | VENT LOCATION | ACTUATOR LOCATION | OWNER CONTROLLER | SHUTTER STATE |
|---|---|---|---|---|
| 0 | B/W CTL0-PS0 | CTL0 | CTL0 | OPEN |
| 1 | B/W CTL1-PS1 | CTL1 | CTL1 | OPEN |

Fig. 13

RESOURCE MANAGEMENT TABLE 1170

| DEVICE | LOCATION | CURRENT STATUS | OWNER CONTROLLER | OPERATION INSTRUCTION |
|---|---|---|---|---|
| POWER UNIT | PS0 | NORMAL | CTL0 | |
| COOLING FAN | PS0 | NORMAL ROTATION | CTL0 | |
| BATTERY | PS0 | STANDBY (100%) | CTL0 | |
| POWER UNIT | PS1 | NORMAL | CTL0 | |
| COOLING FAN | PS1 | NORMAL ROTATION | CTL0 | |
| BATTERY | PS1 | STANDBY (100%) | CTL0 | |
| ... | ... | ... | ... | ... |

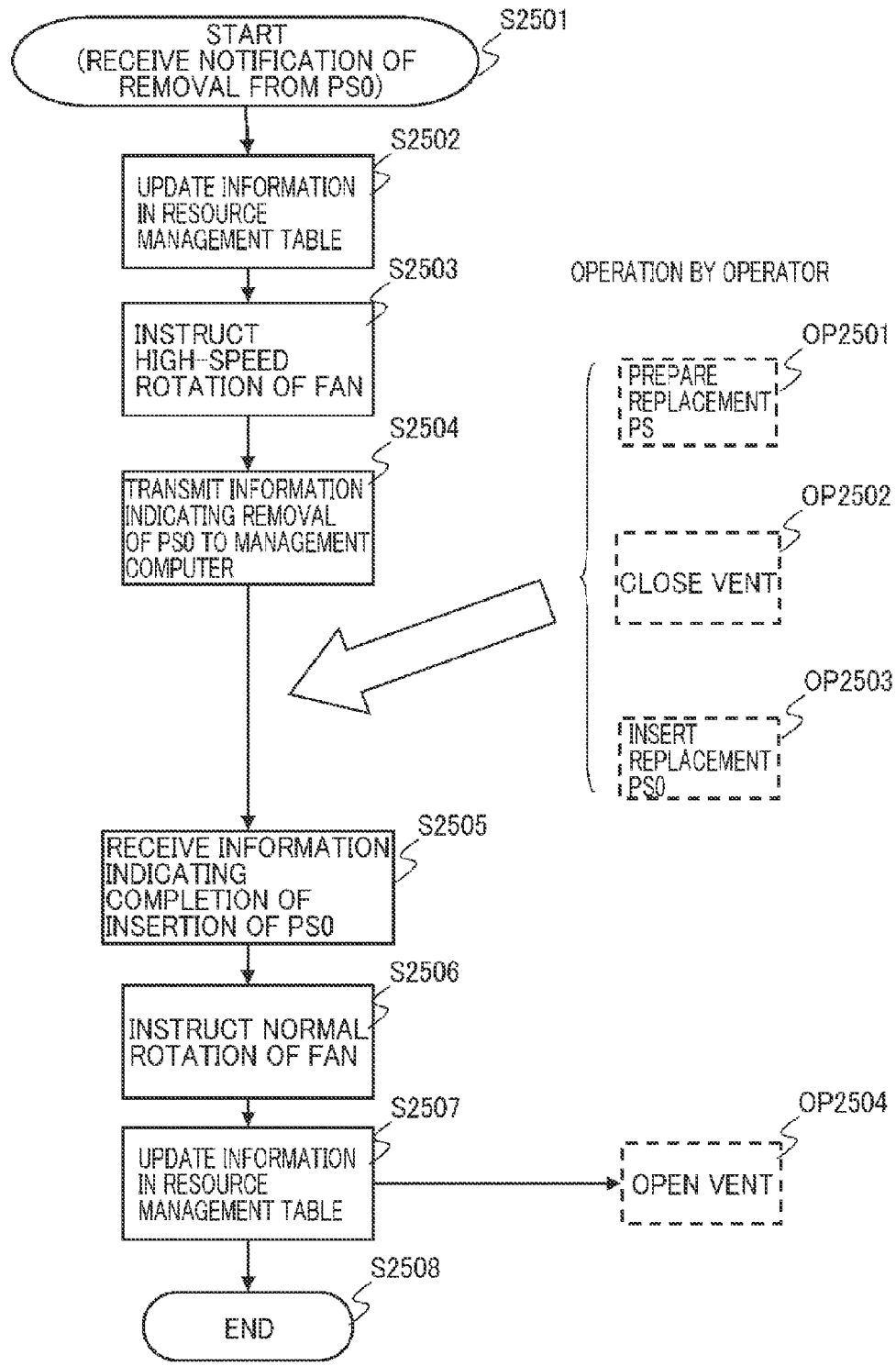

Fig. 29

VENT SHUTTER CONTROL MANAGEMENT TABLE 1140

| VENT SHUTTER ID | VENT LOCATION | ACTUATOR LOCATION | OWNER CONTROLLER | SHUTTER STATE |
|---|---|---|---|---|
| 0 | B/W CTL0-PS0 | CTL0 | CTL0 | CLOSED |
| 1 | B/W CTL1-PS1 | CTL1 | CTL1 | OPENED |

STORAGE APPARATUS AND METHOD OF COOLING STORAGE APPARATUS

TECHNICAL FIELD

This invention relates to a storage apparatus and a method of cooling a storage apparatus.

BACKGROUND ART

Storage apparatuses are designed to provide data storage areas to applications running on host computers (hereinafter, "hosts") such as server computers. In general, the storage apparatuses include a number of physical storage medium and a storage controller which organizes logical storage areas from physical storage areas included in the physical storage medium and controls data input/output processing between the logical storage areas and the hosts.

As the physical storage medium, hard disk drives (hereinafter, "HDDs") can be employed, for example. Moreover, RAID (Redundant Arrays of Independent (or Inexpensive) Disks) is generally employed which uses multiple HDDs to provide redundant logical storage areas, in order to improve the reliability of stored data.

As for small-sized storage apparatuses, it is desired to improve the cooling capability of the storage apparatus itself because of further decrease in the size of the chassis, increase in the number of mounted HDDs due to increase in data capacity, and increase in the amounts of heat generated by major components such as processors. To do so, multiple fans are provided to a functional module, e.g. a power supply module, accommodated in the storage apparatus, and a cooling airflow generated by these fans is caused to flow through the entire apparatus. In this way, a cooling capability necessary for the storage apparatus as a whole is secured.

For the cooling of a computer subsystem such as a storage apparatus, a related technique is disclosed in Patent Literature 1, for example. Patent Literature 1 discloses a configuration in which: a common path through which cooling air is caused to flow by blowers is set within a computer subsystem; and a cooling air volume provided by the blowers and the paths of the cooling air can be adjusted to match cooling capacities required by devices disposed in various locations in the subsystem.

CITATION LIST

Patent Literature

PTL 1: U.S. Patent Application Publication No. 2007-0293137

SUMMARY OF INVENTION

Technical Problem

However, the configuration disclosed in Patent Literature 1 has a problem that it cannot handle a case where a failure occurs in part of the blowers generating the cooling air and thereby makes it impossible to secure a specified cooling air volume. Assume for example that a failure occurs in a functional module such as the one described above having cooling fans incorporated therein and that this functional module is removed from its own storage apparatus. In this case, part of the cooling capability necessary for the storage apparatus is lost as well. The technique in Patent Literature 1 is not designed to be able to handle such a situation.

This invention has been made to solve the above and other problems, and an object thereof is to provide a storage apparatus and a method of cooling a storage apparatus in and by which a cooling capacity necessary for the storage apparatus can be secured even when part of cooling fans provided to the storage apparatus fails to function normally, by using the other part of the cooling fans.

Solution to Problem

To achieve the above and other objects, one aspect of this invention provides a storage apparatus for providing a logical storage area as a data storage area to an external apparatus, comprising a physical storage medium for creating the logical storage area; first and second storage control modules each of which is communicatively coupled to the physical storage medium to control data input/output processing between the external apparatus and the logical storage area; and first and second power supply modules each of which supplies power to the physical storage medium and the first and second storage control modules and includes a blower for generating a cooling airflow to cool down the physical storage medium and the first and second storage control modules, wherein the blower of the first power supply module generates a first cooling airflow which flows through the physical storage medium, the first storage control module, and the first power supply module, the blower of the second power supply module generates a second cooling airflow which flows through the physical storage medium, the second storage control module, and the second power supply module, and in a case where the first power supply module is removed from the storage apparatus, the blower of the second power supply module generates a third cooling airflow which flows through the physical storage medium, the first storage control module, and the second power supply module as a replacement for the first cooling airflow.

Another aspect of this invention provides a method of cooling a storage apparatus including, for providing a logical storage area as a data storage area to an external apparatus, a physical storage medium for creating the logical storage area, first and second storage control modules each of which is communicatively coupled to the physical storage medium to control data input/output processing between the external apparatus and the logical storage area, and first and second power supply modules each of which supplies power to the physical storage medium and the first and second storage control modules and includes a blower for generating a cooling airflow to cool down the physical storage medium and the first and second storage control modules, the method comprising causing the blower of the first power supply module to generate a first cooling airflow which flows through the physical storage medium, the first storage control module, and the first power supply module; causing the blower of the second power supply module to generate a second cooling airflow which flows through the physical storage medium, the second storage control module, and the second power supply module; and in a case where the first power supply module is removed from the storage apparatus, causing the blower of the second power supply module to generate a third cooling airflow which flows through the physical storage medium, the first storage control module, and the second power supply module as a replacement for the first cooling airflow.

Advantageous Effects of Invention

By this invention, a storage apparatus and a method of cooling a storage apparatus are provided in and by which a cooling capacity necessary for the storage apparatus can be secured even when part of cooling fans provided to the storage apparatus fails to function normally, by using the other part of the cooling fans.

BRIEF DESCRIPTION OF DRAWINGS

FIG. 9 is a diagram showing a configuration example of a RAID group management table 1150.

FIG. 10 is a diagram showing a configuration example of a logical volume management table 1160.

FIG. 11A is a diagram showing a configuration example of a device management table 1130.

FIG. 11B is a diagram showing a configuration example of the device management table 1130.

FIG. 12 is a diagram showing a configuration example of a vent shutter control management table 1140.

FIG. 13 is a diagram showing a configuration example of a resource management table 1170.

FIG. 26 is a diagram showing an example of the flow of processing which one of the storage control modules 110 performs in a case where a corresponding one of the power supply modules 120 is removed and the vent shutters ST are of a manual type.

FIG. 29 is a diagram showing a configuration example of the vent shutter control management table 1140 in the state of FIG. 28.

DESCRIPTION OF EMBODIMENTS

Figure 1A:
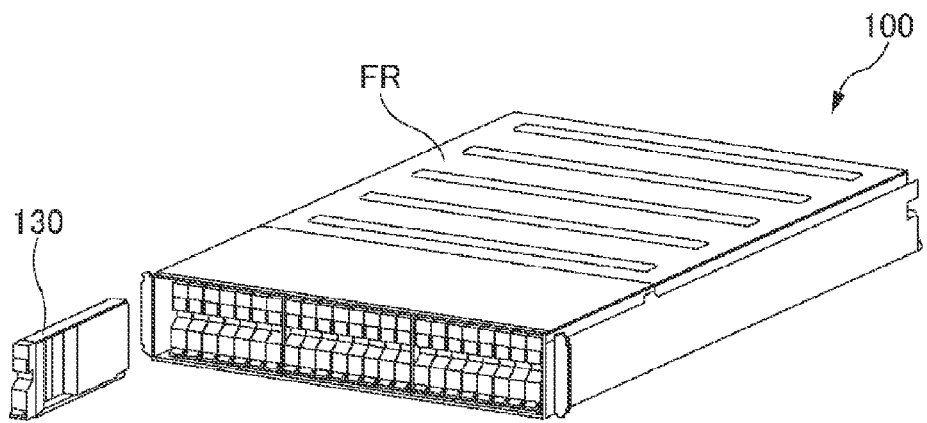
FIG. 1A is a view showing an example of the appearance of a storage apparatus 100 of an embodiment of this invention.

Hereinbelow, modes for carrying out this invention will be described with reference to the drawings. Note that components which are the same across drawings will be denoted by the same reference numeral, and description thereof will be omitted.

Basic Configuration of Storage Apparatus 100

Figure 1B:
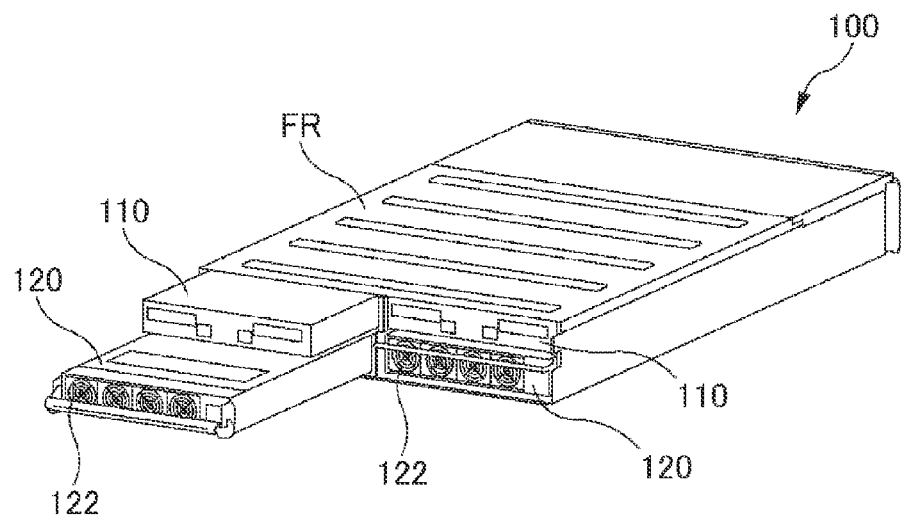
FIG. 1B is a view showing the example of the appearance of the storage apparatus 100 of the embodiment of this invention.
Figure 2:
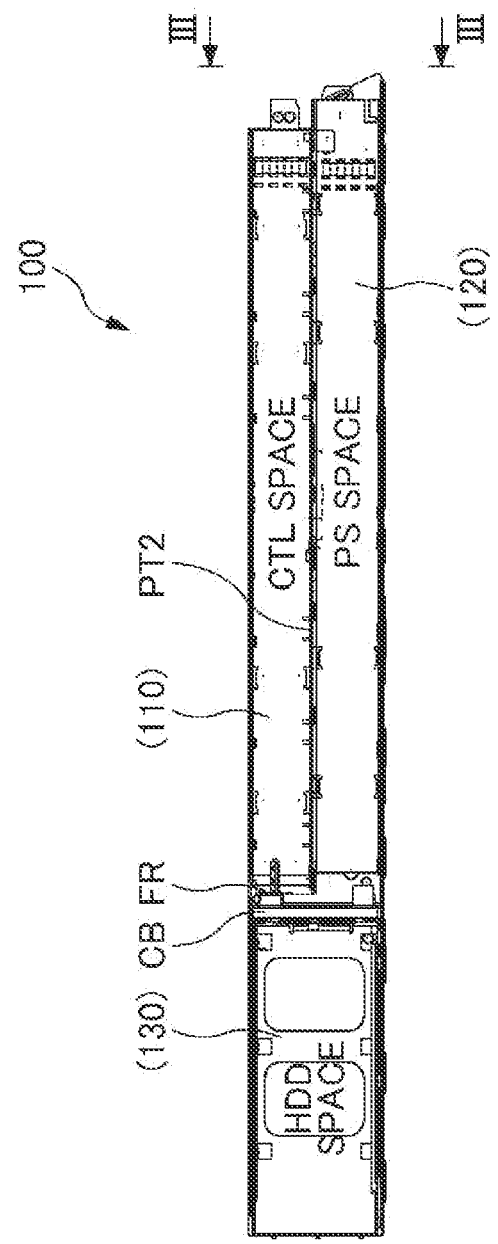
FIG. 2 is a longitudinal cross-sectional view of the storage apparatus 100.
Figure 3:
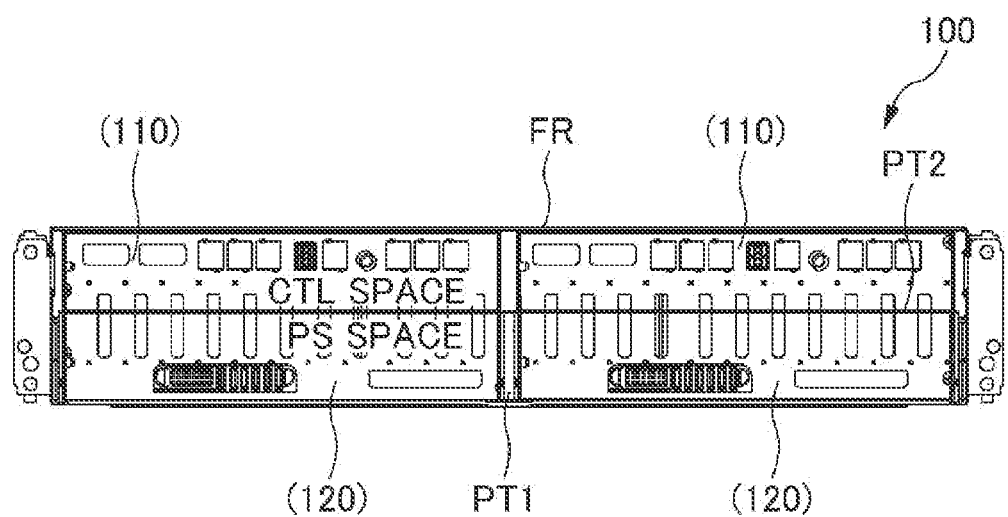
FIG. 3 is a back view of the storage apparatus 100.

First, the basic configuration of a rack-mount storage apparatus 100 of an embodiment of this invention will be described. FIGS. 1A and 1B show an example of the appearance of the storage apparatus 100 of this embodiment of this invention. Moreover, FIG. 2 shows a longitudinal cross-sectional view of a chassis frame FR, and FIG. 3 shows a back view of the chassis frame FR.

The storage apparatus 100 includes: a chassis frame FR which has a rectangular tubular shape in cross section; multiple hard disk drives (hereinafter, "HDDs") 130 which are housed in the chassis frame FR from the front side thereof; and two storage control modules 110 and two power supply modules 120 which are housed in the chassis frame FR from the back side thereof. The chassis frame FR has a structure with which the storage apparatus 100 can be rack-mounted. In this embodiment, the chassis frame FR forms a rack-mount storage apparatus 100 having a height of 2U defined by the EIA (Electronic Industries Alliance) standard. Note that in FIGS. 2 and 3, spaces in which the HDDs 130, the storage control modules 110, and the power supply modules 120 are housed are denoted by (130), (110), (120), respectively.

In the storage apparatus 100 of this embodiment, up to 24 HDDs 130 can be installed, each HDD 130 being a 2.5-inch drive, for example. The storage control modules 110 are housed respectively in left and right upper spaces behind the HDDs 130, and the power supply modules 120 are housed respectively in left and right lower spaces behind the HDDs 130. Specifically, as shown in FIGS. 2 and 3, a circuit board CB on which electrically coupling patterns and necessary connectors between the HDDs 130, the storage control modules 110, and the power supply modules 120, and the like are mounted divides the chassis frame FR in the longitudinal direction of the chassis frame FR into a housing space for the HDDs 130 and a housing space for the storage control modules 110 and power supply modules 120. Moreover, a partitioning plate PT2 which is installed substantially horizontally in the housing space for the storage control modules 110 and power supply modules 120 divides this housing space further into a housing space for the storage control modules 110 and a housing space for the power supply modules 120.

A substantially vertical partitioning plate PT1 also divides each of the housing space for the storage control modules 110 and the housing space for the power supply modules 120. Thus, pairs of storage control module 110 and power supply module 120 are provided respectively in the left and right sides of the chassis frame FR in a back view, forming a duplexed control system for the HDDs 130. Note that each power supply module 120 is provided with cooling fans 122 to be described later.

Figure 4:
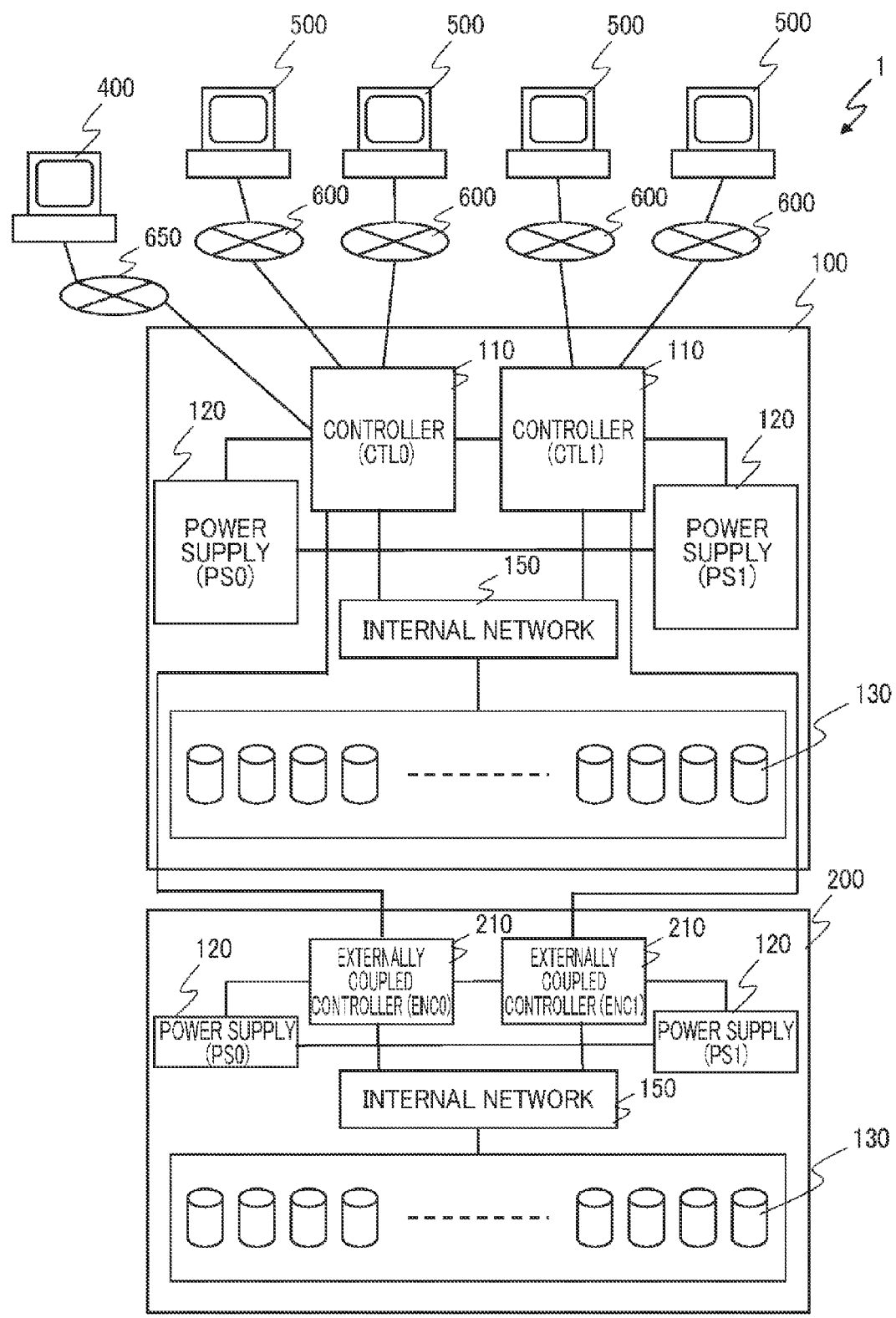
FIG. 4 is a diagram showing a configuration example of a storage system 1 including the storage apparatus 100.

Next, a storage system including the storage apparatus 100 will be described. FIG. 4 shows an example of the configuration of a storage system 1 including the storage apparatus 100. As described above, the storage apparatus 100 includes a pair of storage control modules 110, a pair of power supply modules 120, and multiple HDDs 130. Each storage control module 110 is coupled to one or more hosts 500 through communication networks 600, respectively. Each host 500 is a general computer such as a personal computer (PC). In each host 500, an application can run under the control of an appropriate operation system (OS). The storage apparatus 100 provides a data storage area for the application. Data input/output processing is performed between the hosts 500 and the storage control modules 110 of the storage apparatus 100 through their respective communication networks 600. Each communication network 600 may be configured by a LAN (Local Area Network), a SAN (Storage Area Network), or the like, for example.

One of the storage control modules 110 of the storage apparatus 100 is coupled to a management computer 400 through a communication network 650. The management computer 400 is a general computer such as a PC including input devices such as a keyboard and a mouse and output devices such as a display and a printer. Through the communication network 650 configured for example by a LAN, the management computer 400 can receive monitoring data such as the operation state of the storage apparatus 100 from the storage control module 110, and also give an input of a necessary operation instruction to the storage control module 110. In the management computer 400, various applications including a data input/output interface such as a browser, can run under the control of an appropriate OS.

Each storage control module 110 of the storage apparatus 100 is communicatively coupled to the multiple HDDs 130 through an internal network 150. Each storage control module 110 organizes RAID groups from physical storage areas provided by the HDDs 130 in accordance with appropriate RAID levels, and creates logical volumes as logical storage areas from the RAID groups and provides the logical volumes as the data storage areas for the hosts 500. Each storage control module 110 controls data input/output between the hosts 500 and the HDDs 130.

Each power supply module 120 supplies power necessary for the storage apparatus 100 as a whole including the storage control modules 110 and the HDDs 130. Two pairs of storage control module 110 and power supply module 120 are provided to one storage apparatus 100. The pairs are capable of monitoring each other's operation status, and maintaining the operation of the storage apparatus 100 even when a failure occurs in one of the storage control modules 110 or one of the power supply modules 120. In this way, the reliability of the storage apparatus 100 is improved.

In the storage system 1 with the configuration illustrated in FIG. 4, an optional drive apparatus 200 is externally coupled to the storage apparatus 100. The drive apparatus 200 includes multiple HDDs 130, externally coupled controllers 210, power supply modules 1120, and an internal network 150. The externally coupled controllers 210 are coupled to the storage control modules 110 of the storage apparatus 100, respectively, and perform data input/output processing so that the storage control modules 110 of the storage apparatus 100 can use logical volumes created from the HDDs 130 in the drive apparatus 200 in the same fashion as the logical volumes created from the HDDs 130 in the storage apparatus 100. The externally coupled controllers 210 are designed as a duplexed system as well. The power supply modules 120 and the internal network 150 are the same as those of the storage apparatus 100. For the storage system 1, the drive apparatus 200 is optional as mentioned above and therefore may not necessarily be provided. Instead, two or more drive apparatuses 200 can be added to one storage apparatus 100.

Figure 5:
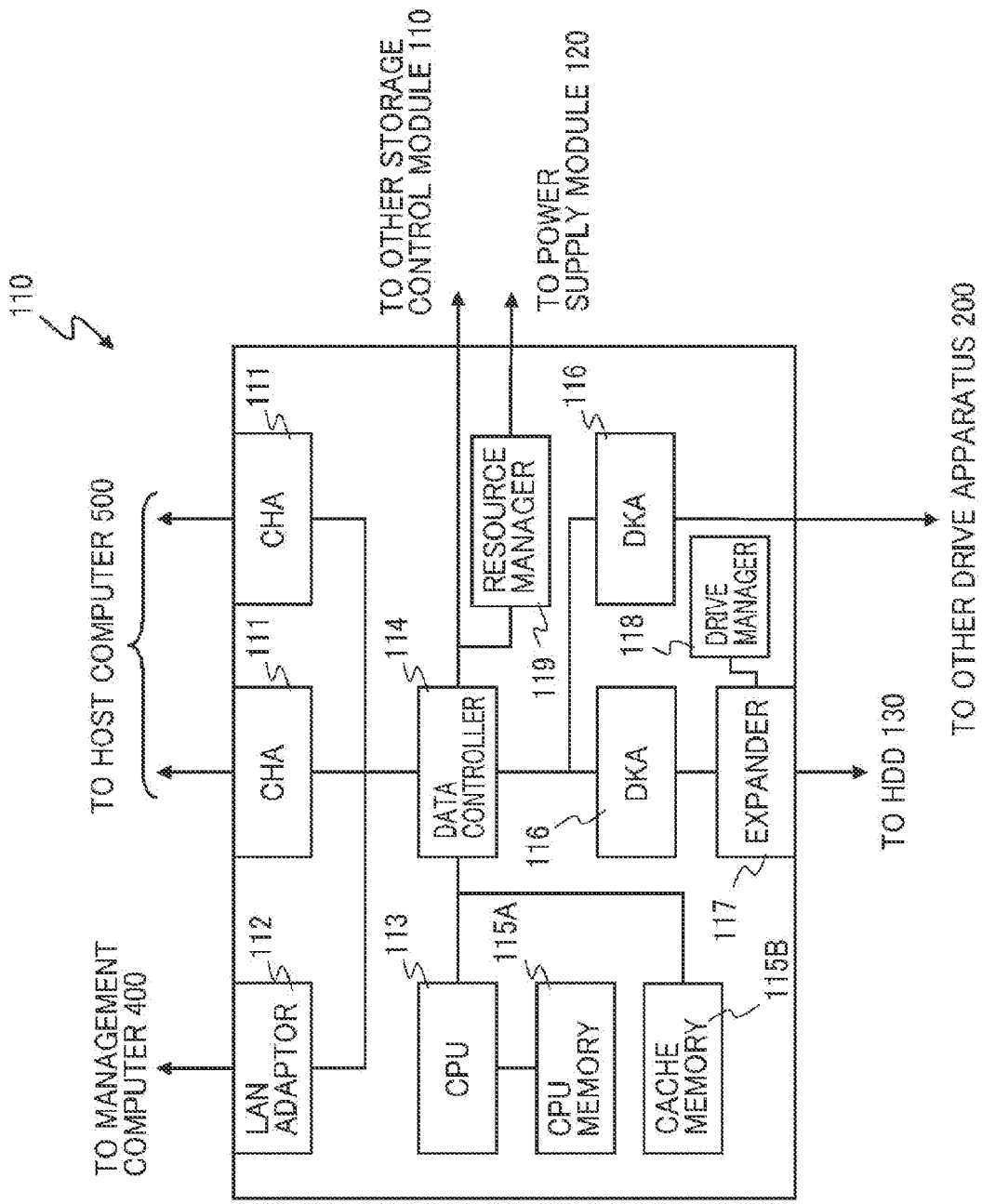
FIG. 5 is a diagram showing a configuration example of each storage control module 110.

Next, the configuration of each storage control module 110 of the storage apparatus 100 will be described in more detail with reference to FIG. 5. FIG. 5 shows a hardware configuration example of each storage control module 110. As described above, each storage control module 110 performs data input/output processing between its corresponding hosts 500 and HDDs 130 serving as data storage areas. Moreover, each storage control module 110 performs processing related to cooling control in the storage apparatus 100 of this embodiment.

The storage control module 110 illustrated in FIG. 5 includes channel adaptors (CHA) 111, a LAN adaptor 1112, a processor 113, a data controller 114, a processor memory 115A, a cache memory 115B, disk adaptors (DKA) 116, an expander 117, a drive manager 118, and a resource manager 119.

The CHAs 111 are interface circuits for communicating with the communication networks 600 such as SANS coupling the storage control module 110 to the hosts 500. Similarly, the LAN adaptor 112 is an interface circuit for communicating with the LAN 650 coupling the storage control module 110 to the management computer 400, and is a network interface card (NEC), for example.

The processor 113 is a unit for executing various programs for implementing later-described functions of the storage control module 110, and is configured as a CPU (Central Processing Unit) or an MPU (Micro Processor Unit), for example. In this description, the processor 133 will be abbreviated as "CPU" below. The data controller 114 is a communication controller which controls data communication between the CPU 113 and units in the other storage control module 110. The CPU memory 115A is a memory which stores data such as various programs for implementing the later-described functions of the storage control module 110, and parameters and various tables used during the execution of the programs, and is configured by a memory, device such as a ROM (Read Only Memory), a RAM (Random Access Memory), or a flash memory. This CPU memory 115A can be accessed not only by the CPU 113 belonging to its own storage control module 110 but also by the CPU 113 belonging to the other storage control module 110 housed in the same storage apparatus 100. The cache memory 115B is a storage area for temporarily storing data to be written from the hosts 500 to the HDDs 130 and data read from the HDDs 130, and is configured by a memory device such as a RAM for example.

The DKAs 116 are disk interface circuits which execute input/output processing of data to and from the HDDs 130 in accordance with data input/output processing executed by the CPU 113. The expander 117 is an interface circuit for coupling the output of one of the DKAs 116 to the HDDs 130 and is selected in accordance with the specification of the HDDs 130 employed. In this embodiment, the expander 117 is a serial attached SCSI (SAS) expander.

The drive manager 118 is a unit having a function to monitor the operation statuses of the HDDs 130 and some other functions, and is configured by an arithmetic operation device such for example as a one-chip microcomputer. The resource manager 119 is an arithmetic operation unit for monitoring the operation statuses of later-described power unit, cooling fans, and battery included in the power supply module 120 and also for giving an input of a necessary instruction. The resource manager 119 is configured by an arithmetic operation device such for example as a one-chip microcomputer.

Note that although the CHAs 111 are provided for two systems and the DKAs 116 are provided for two systems, the number can be one in the example of FIG. 5, or three or more. In addition, the two storage control modules 110 housed in the storage apparatus 100 can access each other so that they can monitor the operation statuses of each other and issue a necessary operation instruction to each other by using known techniques.

Figure 6:
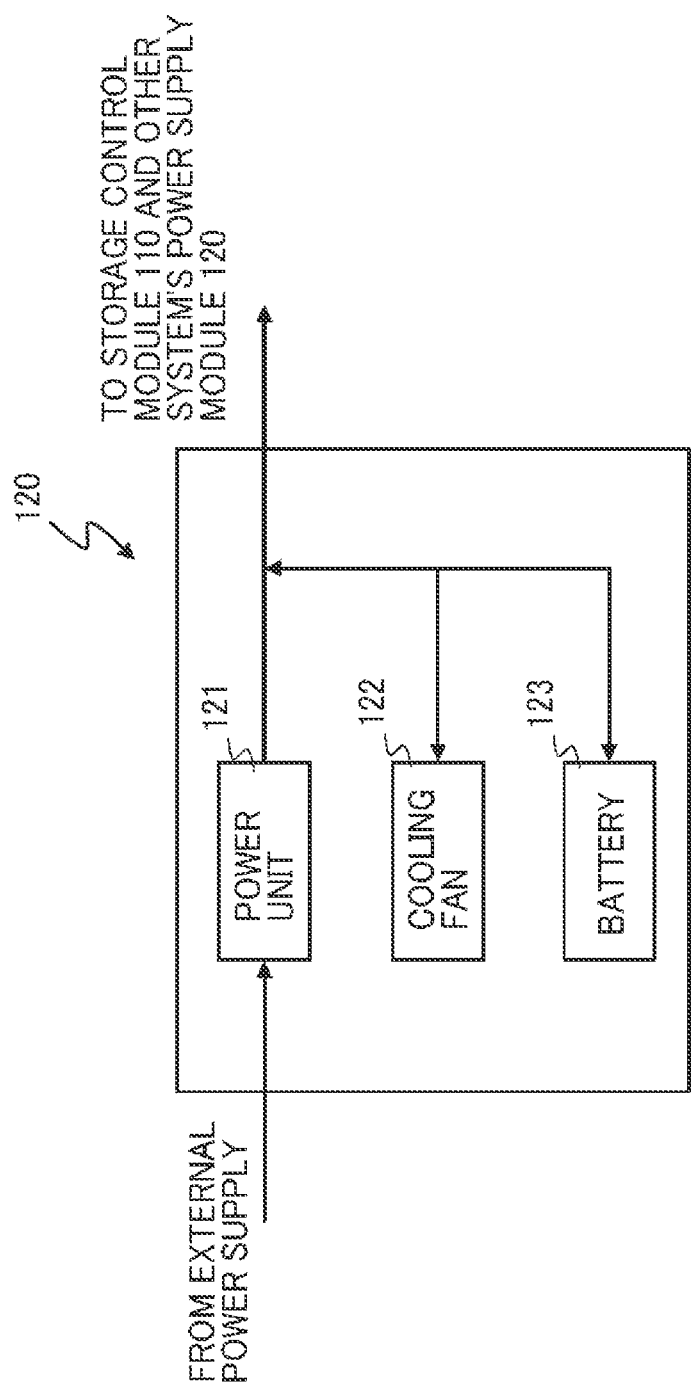
FIG. 6 is a diagram showing a configuration example of each power supply module 120.

Next, a configuration example of each power supply module 120 will be described with reference to FIG. 6. FIG. 6 shows a hardware configuration example of the power supply module 120 of this embodiment. The power supply module 120 is a unit for supplying power to units in the storage apparatus 100 such as the storage control modules 110 and the HDDs 130, and includes a power unit 121, cooling fans 122, and a battery 123.

The power unit 121 is a power supply unit which receives a power from an external power supply (e.g. a commercial power supply with single-phase AC 100V and 50/60 Hz) and converts it into DC powers (e.g. DC24, 12, and 5V) to be consumed in the storage apparatus 100. The power unit 121 is configured by a switching power supply circuit and the like satisfying required input/output characteristics. Each cooling fan 122 is a motor-driven fan which generates cooling air for securing a cooling capacity necessary in the storage apparatus 100. In this embodiment, four exhaust motor-driven fans are provided at the front of the power supply module 120 as illustrated in FIG. 1E. The cooling of the inside of the storage apparatus 100 by the cooling fans 122 will be described later. The battery 123 is configured by a storage battery with a required capacity or the like so that necessary data processing such as the backup of data on the cache memory 115B can be executed in a case where a failure occurs in the external power supply or the power unit 121. During normal time, the battery 123 is in a floating charge state with output current from the power unit 121. Moreover, the output of the battery 123 is coupled also to the other power supply module 120 in the storage apparatus 100. Thus, in a case where a failure occurs in one of the batteries 123, the other is used for backup.

Figure 7:
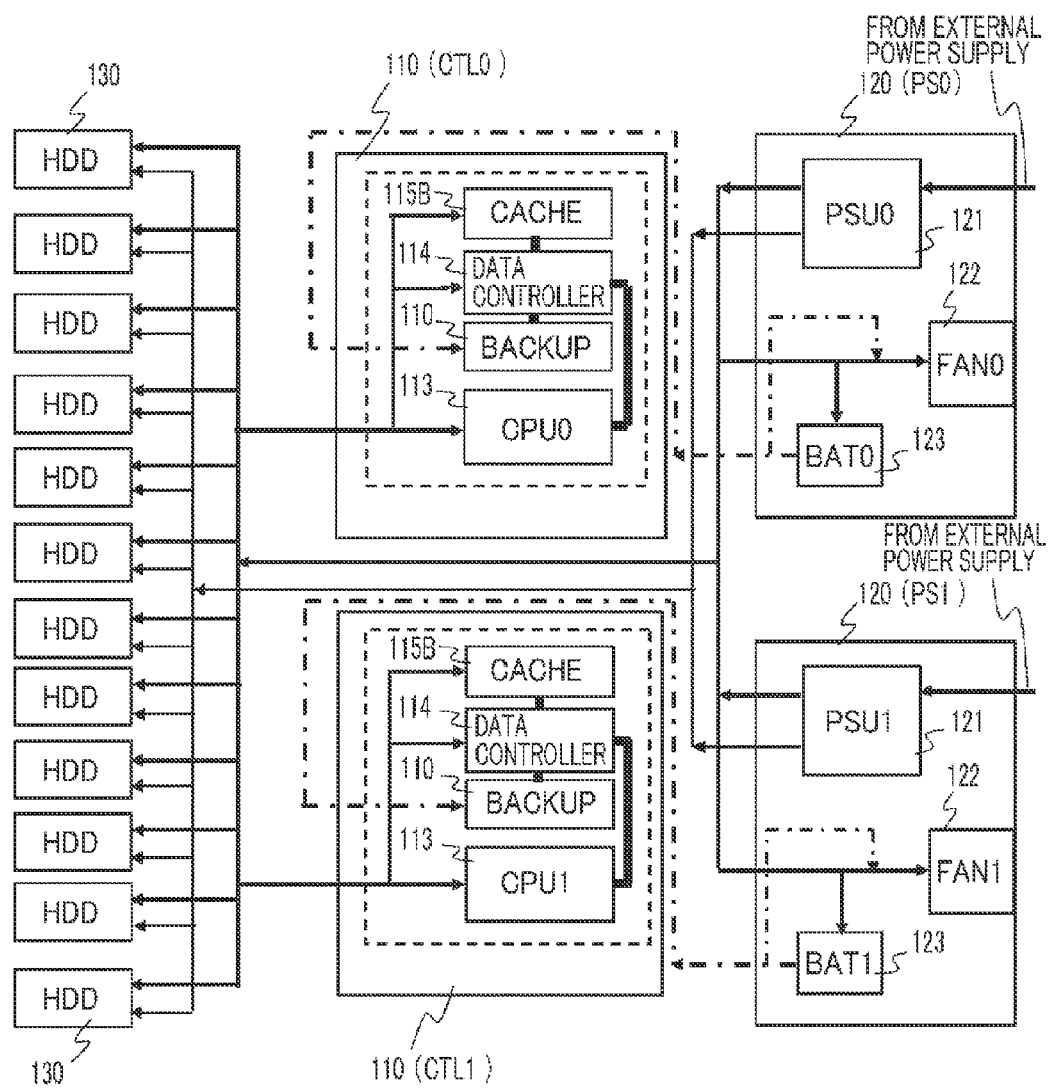
FIG. 7 is a diagram showing a configuration example of power supply systems in the storage apparatus 100.

Next, power supply systems in the storage apparatus 100 of this embodiment will be described. FIG. 7 shows an example of the power supply systems in the storage apparatus 100. As mentioned with reference to FIG. 4, the storage apparatus 100 of this embodiment is provided with two systems of storage control modules 110 and power supply modules 120. During normal time, in the storage apparatus 100, the power supply modules 120 of the two systems receiving power from the external power supply power from their power units 121 to the HDDs 130, the storage control modules 110, the batteries 123, and the cooling fans 122 through routes indicated by solid arrows. In a case where a failure occurs in one of the power units 122, the other, normal power unit 1122 supplies power to each unit in the storage apparatus 100. Thus, after the occurrence of the failure, the administrator can take action such as replacing the one power supply module 120 by following a predetermined procedure. In a case where a failure occurs in both power units 122, the batteries 123 supply power for a predetermined period to the storage control modules 110, the HDDs 130, and the cooling fans 122 through routes indicated by dashed arrows in FIG. 7. During this period, the storage control modules 110 can execute predetermined data backup processing such as destaging processing of data temporarily stored in the cache memories 115B, hence preventing loss of in-process data.

Figure 8:
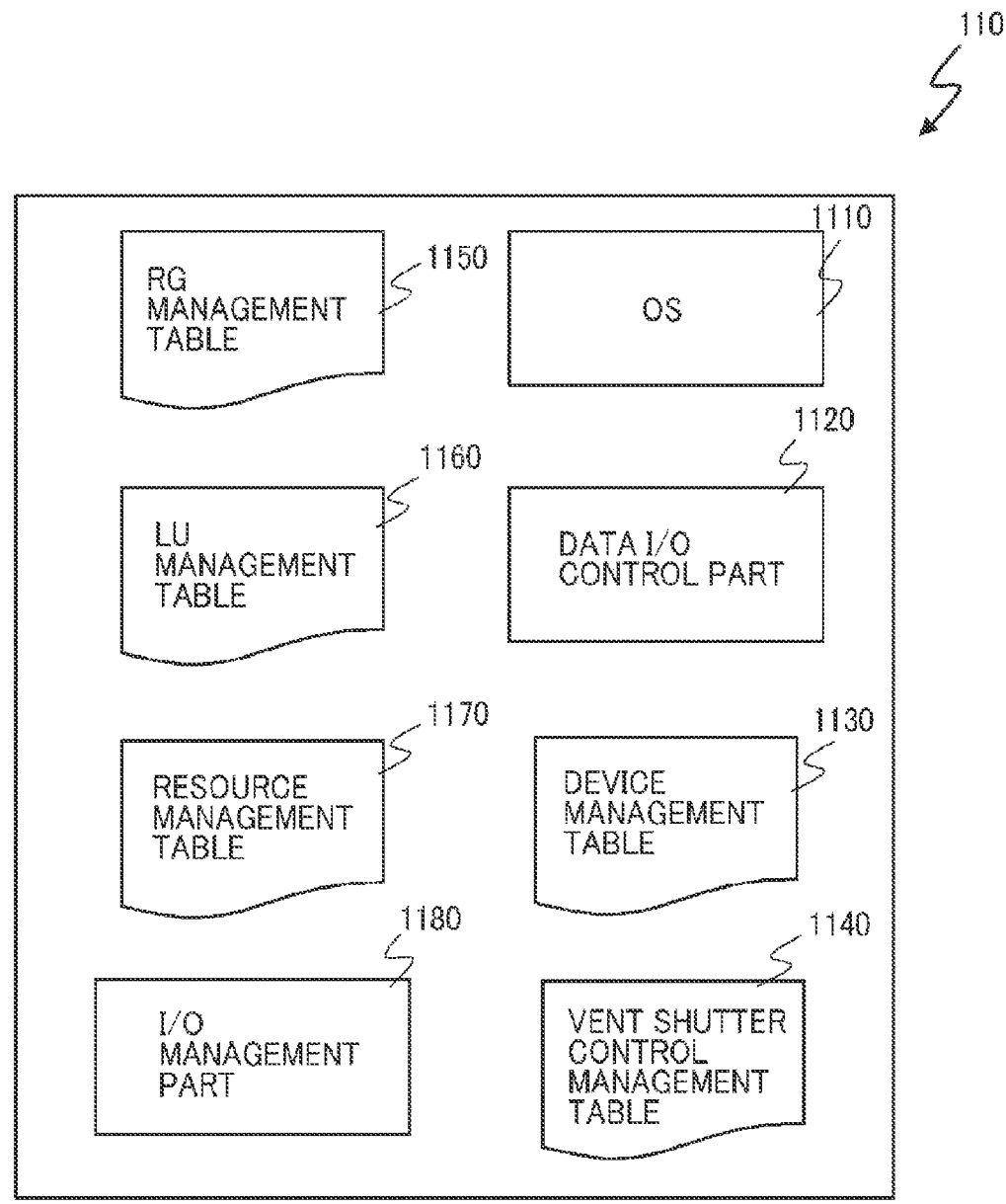
FIG. 8 is a diagram showing an example of the functional block configuration of the storage control module 110.

Next, functions of each storage control module 110 included in the storage apparatus 100 will be described with reference to FIG. 8. FIG. 8 shows a software configuration example including, for implementing the functions of the storage control module 110, programs to be executed by the CPU 113 on the CPU memory 115A of the storage control module 110 and tables to be used by the programs. In the example of FIG. 8, programs of an OS 1110, a data I/O control part 1120, and an I/O management part 1180 are implemented in the storage control module 110. Moreover, tables of a RAID group management table 1150, a logical volume management table 1160, a device management table 1130, a resource management table 1170, and a vent shutter control management table 1140 are stored in the storage control module 110.

The OS 1110 is basic software serving as an execution platform for various programs to be executed by the storage control module 110, and can be selected and used from among various OSs generally used as the OSs of computers. The I/O management part 1180 is a program which manages data input/output (data I/O) processing to and from each program running on the storage control module 110 under the control of the OS 1110. The data I/O control part 1120 is a program which processes data write and read commands from applications running on the hosts 500 coupled to the storage apparatus 100 to thereby execute data write and read processing between the applications and the HDDs 130 of the storage apparatus 100. Moreover, the data I/O control part 1120 additionally has a function to manage logical storage areas assigned to the storage control modules 110 and a function to manage the operation statuses of the cooling fans 122, with the help of the resource manager 119. Note that the latter, additional functions may be configured by programs different from the data I/O control part 1120.

Next, the tables in the storage control module 110 illustrated in FIG. 8 will be described. The RAID group (RG) management table 1150 is a table defining, with the help of the data I/O control part 1120, the relationship between RAID groups organized from multiple HDDs 130 and the HDDs 130 included in the RAID groups. FIG. 9 shows a configuration example of the RG management table 1150 of this embodiment. As shown in FIG. 9, the RG management table 1150 records items of: RAID group number 1151; RAID level 1152; start HDD position 1153 including chassis number 11531 and HDD position 11532; last HDD position 1154 including, likewise, chassis number 11541 and HDD position 11542; the number of components 1155; and user's available area 1156.

The RAID group number 1151 is an identification number given to distinguish one RAID group from another. The RAID level 1152 shows a RAID level employed in the RAID group specified by the corresponding RAID group number 1151. The start HDD position 1153 shows a physical position within the storage apparatus 100 at which the first one of HDDs 130 is disposed, the HDDs 130 included in the RAID group specified by the corresponding RAID group number 1151. Similarly, the last HDD position 1154 shows a physical position within the storage apparatus 100 at which the last one of the HDDs 130 is disposed, the HDDs 130 included in the RAID group specified by the corresponding RAID group number 1151. The number of components 1155 shows the number of HDDs 130 included in the RAID group specified by the corresponding RAID group number 1151. The user's available area 1156 shows the capacity of a storage area, in the RAID group specified by the corresponding RAID group number 1151, which the user can use for data storage. For example, the first entries in FIG. 9 record that a RAID group specified by a RAID group number "0" has a RAID level "5" and includes six HDDs 130 which have a chassis number "0" and are arrayed from a position "0" to a position "5" and that the user can use a 500 GB storage capacity.

Next, the logical volume management table 1160 will be described. FIG. 10 shows a configuration example of the logical volume management table 1160. As shown in FIG. 10, the logical volume management table 1160 records items of logical volume number 1161, RG number of LU location 1162, used capacity 1163, starting position within RG 1164, owner controller information 1165. The logical volume management table 1160 records information on logical volumes on a basis of which logical storage areas set within the RAID groups shown in FIG. 9 are defined. The logical volume number 1161 is an identification number for distinguishing one logical volume from another, the logical volumes being set to RAID groups. The RU number of LU location 1162 records a RAID group belonging to the logical volume specified by the corresponding logical volume number 1161, by using the RAID group number 1151 in FIG. 9. The used capacity 1163 records a logical storage capacity used by the logical volume specified by the corresponding logical volume number 1161. The starting position within RU 1164 records the starting address of a logical storage area of the corresponding logical volume within the RAID group which the logical volume belongs to. The owner controller information 1165 records an identification code of the storage control module 110 serving as an owner controller managing data I/O processing to and from the logical volume specified by the corresponding logical volume number 1161. The identification code is recorded as "CTL0" or "CTL1." The owner controller information 1165 records the identification code for each of normal operation time 11651, PS0 (power supply module 120) abnormal time 11652, and PS1 abnormal time 11653 separately. For example, the first entries in FIG. 10 record that a logical volume "0" belongs to a RAID group "0" and that the used storage capacity and starting address thereof are 100 GB and "00010," respectively. Moreover, referring to the owner controller information 1165, it records that the owner of the logical volume "0" during normal time is the "CTL0" and that the owner is switched to the "CTL1" during PS0 abnormal time. As will be described later, during PS0 abnormal time, the CTL0, which is cooled by the cooling fans 122 of the PS0 during normal time, needs to be cooled by the cooling fans 122 of the normal PS1. Thus, the ownership is passed to the other one, or the CTL1, for the purpose of minimizing the processing load on the CTL0.

Next, the device management table 1130 will be described. FIGS. 11A and 11B show configuration examples of the device management table 1130. The device management table 1130 records the allocation of the storage control modules 110 regarding the management of the power units 121, the cooling fans 122, and the batteries 123 included in the power supply modules 120. Referring first to FIG. 11A, the device management table 1130 includes items of device 11311, location 11132, normal time owner controller information 1133, and CTL0 abnormal time owner controller information 1134. The device 1131 records the type of the management target device as "power unit," "cooling fan," "battery," or the like. The location 1132 records which one of the two power supply modules 120 in the storage apparatus 100 includes the corresponding device 1131, by using different codes "PS0" and "PS1." The normal time owner controller information 1133 records an owner controller responsible for con-trolling, during normal time, the device specified by the device 1131. The CTL0 abnormal time owner controller information 1134 records a substitute owner controller used in a case where a failure occurs in the storage control module 110 specified by the corresponding normal time owner controller information 1133. The example of FIG. 11A shows that the storage control module 1110 specified by "CTL0" manages both of the power supply modules 120 in the storage apparatus 100 and that the "CTL1" storage control module 110 instead manages the power supply modules 120 in a case where a failure occurs in the "DIA"

FIG. 11B shows another configuration example of the device management table 1130. The device management table 1130 in FIG. 11B records an item of CTL1 abnormal time owner controller information 1135 in addition to the items in the device management table 1130 in FIG. 11A. In the device management table 1130 in FIG. 11B, the "PS0" and "PS1" power supply modules 120 are managed by the "CTL0" and "CTL1" storage control modules 110, respectively, as recorded in the item of the normal time owner controller information 1133. Thus, in a case where a failure occurs in one of the "CTL0" and "CTLA" storage control modules 110, the management of the "PS0" and "PS1" power supply modules 120 can be maintained by the other storage control module 110.

Next, the vent shutter control management table 1140 will be described. FIG. 12 shows a configuration example of the vent shutter control management table 1140. In this embodiment, as will be described later in detail, vents VT are provided to control the states of cooling air paths leading from the storage control modules 110 to the power supply modules 120 housed in the storage apparatus 100. The vent shutter control management table 1140 is used to record the managed states of shutters ST that control the open/closed states of these vents VT. The vent shutter control management table 1140 in FIG. 12 records items of vent shutter ID 1411, vent location 1142, actuator location 1143, owner controller 1144, and shutter state 1145. The vent shutter ID 1141 is an identification code given to distinguish one vent shutter ST from another. The vent location 1142 shows the location of a vent VT provided with the vent shutter ST specified by the corresponding vent shutter ID 1141. The actuator location 1143 shows a location at which actuators ACT are attached, the actuators ACT being configured to perform opening/closing operations of the vent shutter ST specified by the corresponding vent shutter ID 1141. The owner controller 1144 records the type of the storage control module 110 managing the driving of the actuators of the corresponding vent shutter ST. The shutter state 1145 shows the open/closed state of the corresponding vent shutter ST. The exemplary first entries in FIG. 12 show that: a vent shutter ST indicated by a vent shutter ID "0" is provided between the "CTL0" storage control module 110 and the "PS0" power supply module 120; the actuators for driving the opening and closing of the vent shutter ST are provided to the storage control module "CTL0" and controlled by the "CTL0;" and the current state of the vent shutter ST is an open state. Note that no settings may be made in the vent shutter control management table 1140 in a case of a configuration in which the vent shutters ST are operated manually.

Next, the resource management table 1170 will be described. FIG. 13 shows a configuration example of the resource management table 1170. The resource management table 1170 is set for each of the resource managers 119 of the storage control modules 110 and records the statuses of the devices included in the power supply modules 120, i.e., the power units 121, the cooling fans 122, and the batteries 123, as well as the contents of operation instructions issued to the devices from the CPUs 113 of the storage control modules 110. The resource management table 1170 in FIG. 13 records items of device 1171, location 1172, current status 1173, owner controller information 1174, and operation instruction 1175. The device 1171 shows types corresponding to the power unit 121, the cooling fans 122, and the battery 123 included in each power supply module 120. The location 1172 shows to which one of the "PS0" and "PS1" power supply modules 120 the device 11171 is provided. The current status 1173 shows the current operation status of the device 1171. The owner controller information 1174 specifies the storage control module 110 managing the operation status of the device 1171 as "CLT0" or the like, in a case where the device 1171 is instructed by its owner controller to operate in an operation mode that is different from a normal one, the operation instruction 1175 records the content of the operation instruction. For example, the entries in the first three rows in FIG. 13 show that the current statuses of the power unit 121, the cooling fans 122, and the battery 123 in the PS0 power supply module 120 are normal, normal rotation, and standby (charge percentage of 100%), respectively, and they are controlled by the storage control module CTL0. Incidentally, it is shown that the owner controller has not issued any operation instruction 1175 to any of the devices 1171. The owner controller can give a "high-speed rotation" instruction to the item of the operation instruction 1175 of the cooling fans 122, for example. Specifically, in a case where a failure occurs in one of the power supply modules 120 or one of the power supply modules 120 is removed, the owner controller instructs the cooling fans 122 of the other power supply module 120 to perform "high-speed rotation." In this way, a cooling air volume required for the storage apparatus 100 can be secured.

Figure 14:
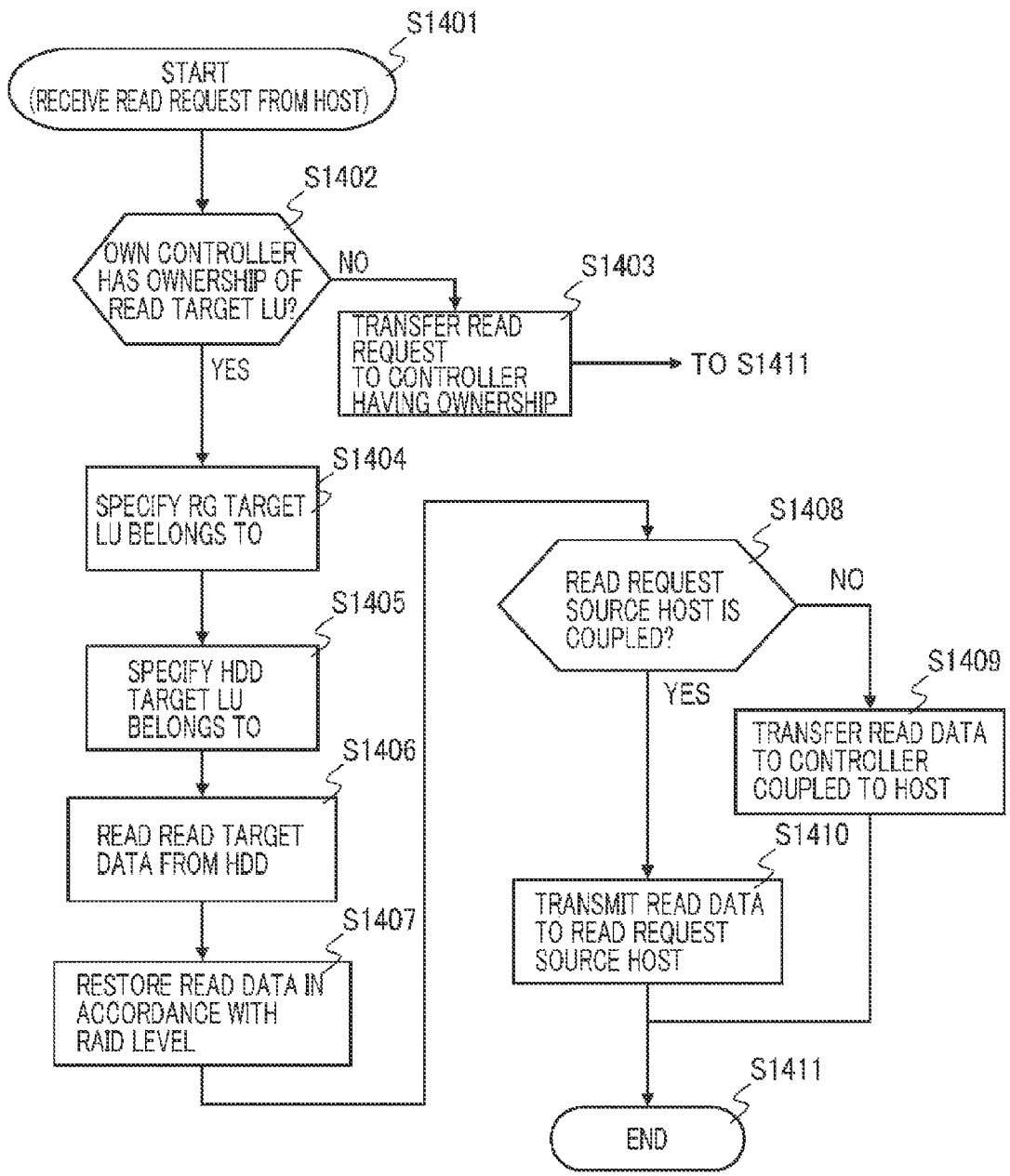
FIG. 14 is a diagram showing an example of the flow of processing a data read request in the storage apparatus 100, the data read request being received from a host.

Next, data processing by the storage apparatus 100 of this embodiment having the above-described configuration will be described. Referring to FIG. 14, the description will be given firstly on data processing which the data I/O control part 1120 of the storage control module 110 executes when the storage apparatus 100 of this embodiment receives a data read request from a host 500. FIG. 14 shows an example of the flow of processing a data read request by the data I/O control part 1120. Note that in the following part of this application, processing steps shown in flowcharts are accompanied with a reference sign "S."

First, upon receipt of a data read request from a host 500 (S1401), the data I/O control part 1120 refers to the logical volume management table 1160 to determine whether the storage control module 110 which the data I/O control part 1120 belongs to has the ownership of a logical volume (hereinafter, "LU") being the processing target of the data read request (S1402). If determining that the storage control module 110 the data I/O control part 1120 belongs to does not have the ownership (No in S1402), the data I/O control part 1120 transfers the data read request to the storage control module 110 having the ownership of the processing target on the basis of the recorded contents in the logical volume management table 1160, and then ends the processing (S1403, S1411). The destination storage control module 110 will execute the subsequent processing of the data read request.

If determining that the storage control module 110 the data I/O control part 1120 belongs to has the ownership (Yes in S1402), the data I/O control part 1120 refers to the RAID group management table 1150 to specify the RAID group which the read target LU belongs to (S1404) and further specify the HDDs 130 which the read target LU belongs to (S1405). Then, the data I/O control part 1120 reads the read target data from the specified HDDs 130 (S1406) and restores the read data in accordance with the RAID level employed in the RAID group the read target LU belongs to (S1407).

Then, the data I/O control part 1120 determines whether the host 500 being the request source of the data read request is coupled to the storage control module 110 the data I/O control part 1120 belongs to (S1408). If determining that the host 500 is not coupled to the storage control module 110 the data I/O control part 1120 belongs to (No in S1408), the data I/O control part 1120 transfers the read data to the other storage control module 110 coupled to the host 500, and then ends the processing (S1409, S1411). The destination storage control module 110 will transmit the read data to the host 500 being the data read request source. If determining that the host 500 being the data read request source is coupled to the storage control module 110 the data I/O control part 1120 belongs to (Yes in S1408), the data I/O control part 1120 transfers the read data to the host 500 being the data read request source, and then ends the processing (S1410, S1411). By the above data processing flow illustrated in FIG. 14, read processing of data stored in the storage apparatus 100 is achieved.

Figure 15:
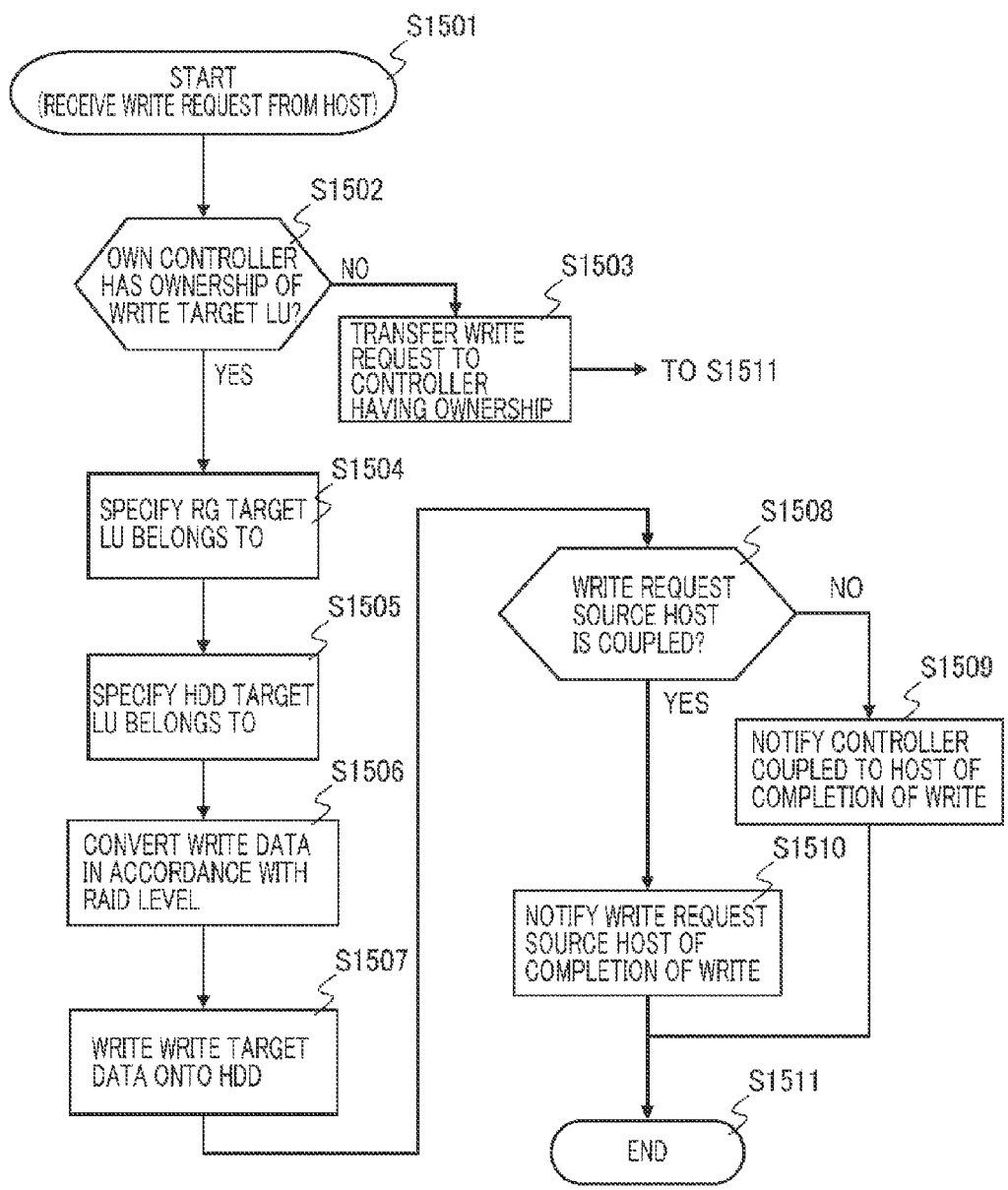
FIG. 15 is a diagram showing an example of the flow of processing a data write request in the storage apparatus 100, the data write request being received from a host.

Referring to FIG. 15, the description will be given next of data processing which the data I/O control part 1120 of the storage control module 110 executes when the storage apparatus 100 of this embodiment receives a data write request from a host 500, FIG. 15 shows an example of the flow of processing a data write request by the data I/O control part 11120.

First, upon receipt of a data write request from a host 500 (S1501), the data I/O control part 1120 refers to the logical volume management table 1160 to determine whether the storage control module 110 which the data I/O control part 1120 belongs to has the ownership of a LU being the processing target of the data write request (S1502). If determining that the storage control module 110 the data I/O control part 1120 belongs to does not have the ownership (No in S1502), the data I/O control part 1120 transfers the data write request to the storage control module 110 having the ownership of the processing target LU on the basis of the recorded contents in the logical volume management table 1160, and then ends the processing (S1503, S1511). The destination storage control module 110 will execute the subsequent processing of the data write request.

If determining that the storage control module 110 the data I/O control part 1120 belongs to has the ownership (Yes in S1502), the data I/O control part 1120 refers to the RAID group management table 1150 to specify the RAID group which the write target LU belongs to (S1504) and further specify the HDDs 1130 which the write target LU belongs to (S1505). Then, the data I/O control part 1120 converts write data in accordance with the RAID level employed in the RAID group the write target LU belongs to (S1506) and writes the write target data onto the specified HDDs 130 (S1507).

Then, the data I/O control part 1120 determines whether the host 500 being the request source of the data write request is coupled to the storage control module 110 the data I/O control part 1120 belongs to (S1508). If determining that the host 500 is not coupled to the storage control module 110 the data. I/O control part 1120 belongs to (No in S1508), the data I/O control part 1120 transmits a notification of the completion of the data write to the other storage control module 110 coupled to the host 500, and then ends the processing (S1509, S1511). The destination storage control module 110 will transmit the data write completion notification to the host 500 being the data write request source. If determining that the host 500 being the data write request source is coupled to the storage control module 110 the data I/O control part 1120 belongs to (Yes in S1508), the data I/O control part 1120 transmits the data write completion notification to the host 500 being the data write request source, and then ends the processing (S1510, S1511). By the above data processing flow illustrated in FIG. 15, write processing of data to the storage apparatus 100 is achieved.

Figure 16A:
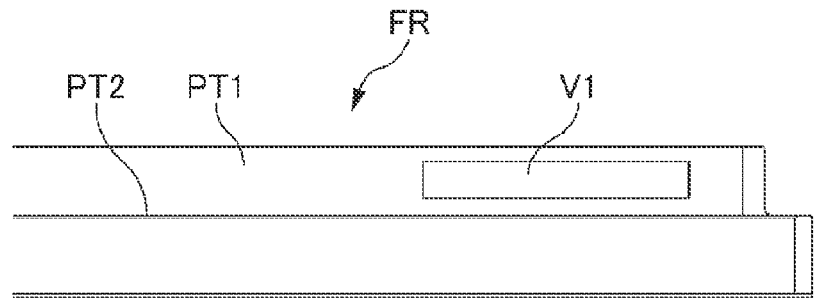
FIG. 16A is a schematic longitudinal cross-sectional view of a chassis frame FR included in the storage apparatus 100.
Figure 16B:
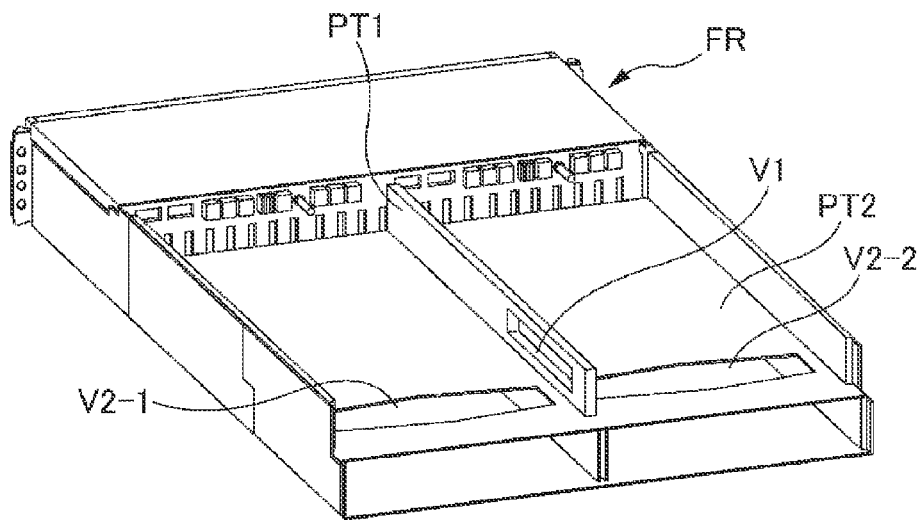
FIG. 16B is a perspective view showing the appearance of the chassis frame FR.
Figure 16C:
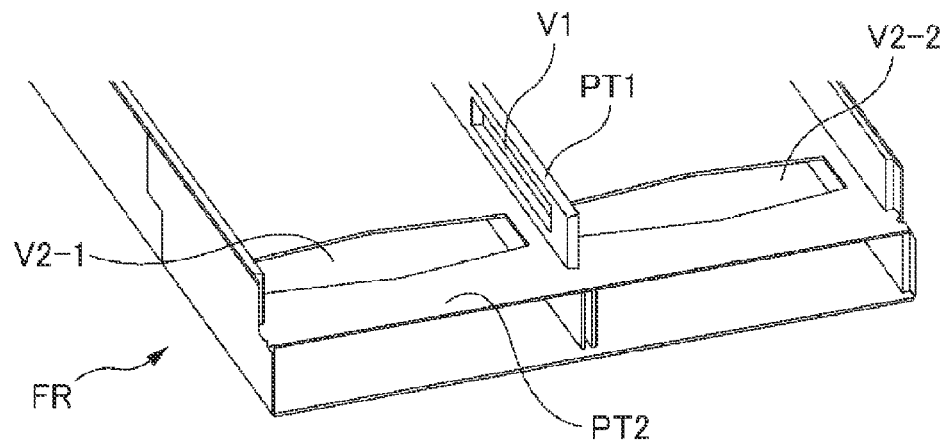
FIG. 16C is an enlarged view of a portion including vents V2-1 and V2-2 of the chassis frame FR in FIG. 16B.

Next, a cooling structure employed in the storage apparatus 100 of this embodiment and cooling air path control achieved by utilizing this cooling structure will be described. FIGS. 16A to 16C schematically show the basic structure of the chassis frame FR of the storage apparatus 100 of this embodiment. FIG. 16A is a partial longitudinal cross-sectional view of the chassis frame FR. FIG. 16B is a top perspective view of the chassis frame FR with its top panel removed. FIG. 16C is a partial enlarged view of FIG. 16B.

As described with reference to FIG. 1, the chassis frame FR of the storage apparatus 100 has a rectangular tubular shape in cross section, and the circuit board CB is placed traversing the tubular inner space to divide the chassis frame FR into two sections in the axial direction thereof, 24 HDDs 130 are accommodated at the far side of the circuit board CB in FIG. 16B. In the chassis frame FR, a tubular inner space at the near side of the circuit board CB is divided in the left-right direction by the partitioning plate PT1 and in the top-bottom direction by the partitioning plate PT2, thereby forming four accommodation spaces. In this embodiment, of the four accommodation spaces, the left upper space and the left lower space accommodate the storage control module 110 and the power supply module 120 of a first system, respectively. Moreover, of the four accommodation spaces, the right upper space and the right lower space accommodate the storage control module 110 and the power supply module 120 of a second system, respectively. Note that the names, first system and second system, correspond respectively to the pair of storage control module CTL0 and power supply module PS0 and the pair of storage control module CTL1 and power supply module PS1 in the system configuration diagram in FIG. 4. In the following description, the modules will be described as storage control modules CTL0 and CTL1 and power supply modules PS0 and PS1 when they need to be distinguished by the systems. Likewise, the devices provided in the modules will be distinguished by adding additional characters of 0 and 1 when needed.

The partitioning plate PT1 is provided with a vent V1 that allows air to flow between the left and right upper spaces in the chassis frame FR. Moreover, the partitioning plate PT2 is provided with vents V2-1 and V2-2 that allow air to flow between the left upper and lower spaces in the chassis frame FR and between the right upper and lower spaces in the chassis frame FR, respectively. Specific functions of the vents V1, V2-1, and V2-2 will be described later. Note that the material of the chassis frame FR is not limited to a specific one, and its specific shape is not limited to the contents depicted in this application. Moreover, the shapes, dimensions, and specific arrangement positions of the vents V1, V2-1, and V2-2 are not limited to the contents depicted in this application.

Figure 17A:
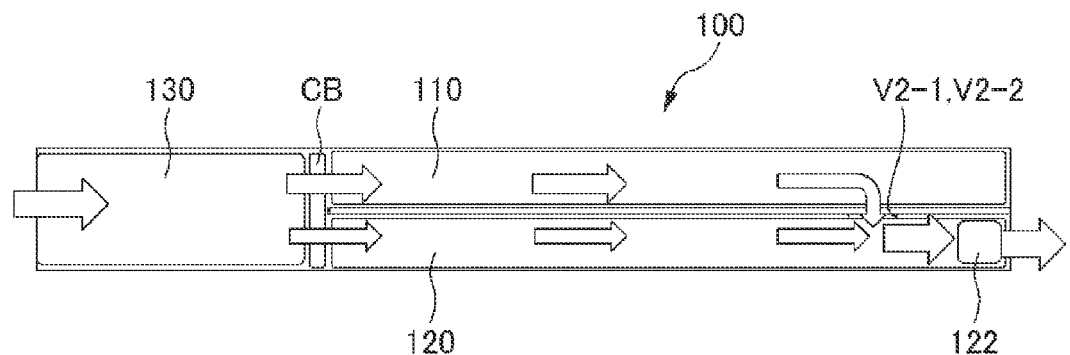
FIG. 17A is an explanatory diagram showing cooling paths inside the storage apparatus 100.
Figure 17B:
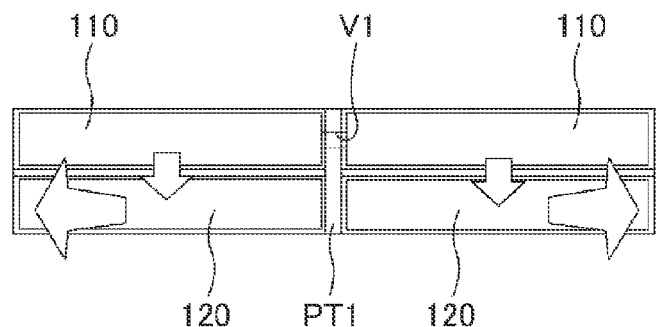
FIG. 17B is an explanatory diagram showing the cooling paths inside the storage apparatus 100.
Figure 17C:
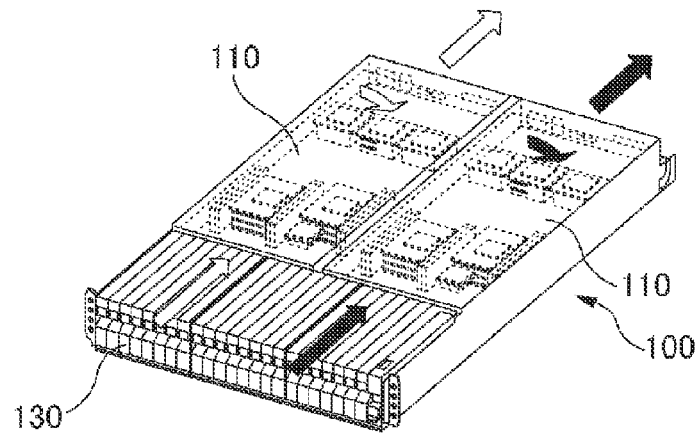
FIG. 17C is an explanatory diagram showing the cooling paths inside the storage apparatus 100.
Figure 17D:
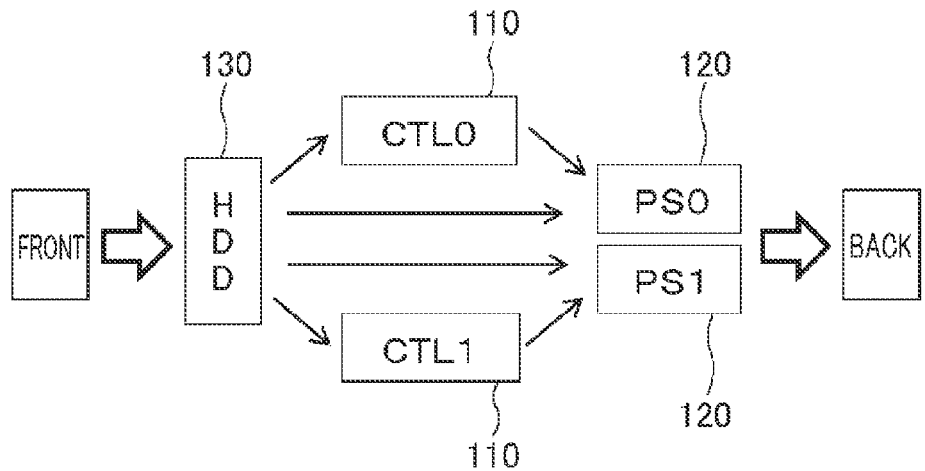
FIG. 17D is an explanatory diagram showing the cooling paths inside the storage apparatus 100.

Next, a method of cooling the inside of the storage apparatus 100 will be described with reference to FIGS. 17A to 17D. FIG. 17A is a schematic longitudinal cross-sectional view of the storage apparatus 100. FIG. 17B is a schematic transverse cross-sectional view of the storage apparatus 100. FIG. 17C is a schematic transparent view showing how cooling is performed inside the storage apparatus 100, FIG. 17D is a schematic system diagram showing how the cooling is performed inside the storage apparatus 100.

As shown in FIGS. 17A and 1713, the inside of the storage apparatus 100 is divided by the circuit board CB into a space for housing the HDDs 130 and a space for housing the storage control modules 110 and the power supply modules 120. The space for housing the storage control modules 110 and the power supply modules 120 is divided into upper and lower sides by the partitioning plate PT2. The upper side houses each storage control module 110 whereas the lower side houses each power supply module 120. As shown in FIG. 17A, the cooling fans 122 are provided in a back end portion of each of the power supply modules 120. These cooling fans 122 are exhaust-type motor-driven fans which suck air from the inside of the power supply modules 120. As shown in FIGS. 17A to 17C, the cooling fans 122 generate cooling airflows that pass through interstices between the HDDs 130 and vents provided in the circuit board CB. These cooling airflows then pass through the inside of the storage control modules 110 and of the power supply modules 120 to cool down heat-generating components mounted therein. The cooling airflows passing through the power supply modules 120 are sucked directly to the outside by the cooling fans 122. On the other hand, the cooling airflows passing through the inside of the storage control modules 110 on the upper side are guided to the inside of the power supply modules 120 on the lower side through the vents V2-1 and V2-2 provided in the partitioning plate PT2 partitioning the inside of the storage apparatus 100 into the upper and lower sides, and then released to the outside by the cooling fans 122. FIG. 17D schematically shows the paths of the above cooling airflows (first cooling airflow and second cooling airflow) as: HDDs 130 in front side of storage apparatus 100--->storage control modules CTL0, CTL1--->power supply modules PS0, PS1--->back of storage apparatus 100. Note that as shown in FIGS. 16A to 16C and 17B, the partitioning plate PT1 partitioning the inside of the storage apparatus 100 into the left and right sides is provided with the vent V1, and moreover the vents V2-1 and V2-2 of the partitioning plate PT2 are provided in the vicinity thereof. The vent V1 functions as a cooling airflow path to secure a cooling capacity necessary for the storage apparatus 100 in the event of a failure in one of the power supply modules 120, which is described below. Moreover, a vent such as punched holes is provided in the lower surface of each of the storage control modules 110 and the upper surface of each of the power supply modules 120 at a position coinciding with the corresponding one of the vents V2-1 and V2-2, so as to form cooling airflow paths respectively leading from the storage control modules 110 to the power supply modules 120 through the vents V2-1 and V2-2.

Now, assume that in the storage apparatus 100 having the above-described cooling structure, one of the power supply modules 120 has lost its function due to some reason. In that case, since the cooling fans 122 are mounted in the power supply modules 120, no cooling airflow is introduced into one of the cooling airflow paths in FIG. 17C in the storage control module 110 belonging to the same system as that of the power supply module 1120 having lost the function of its cooling fans 122. In this case, the storage apparatus 100 fails to cool down the storage control module 110 properly, causing overheating of components mounted therein. Thus, the storage apparatus 100 is unable to maintain a normal running state.

Figure 18A:
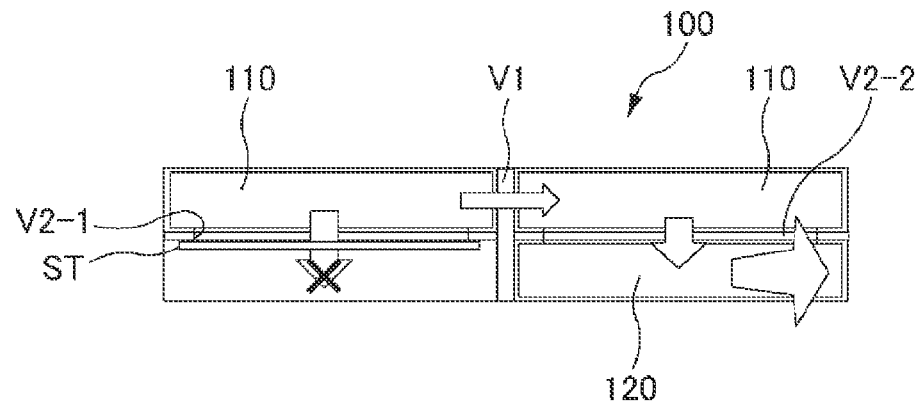
FIG. 18A is an explanatory diagram showing cooling paths inside the storage apparatus 100 in a case where one of the power supply modules 120 equipped with cooling fans 122 is removed.
Figure 18B:
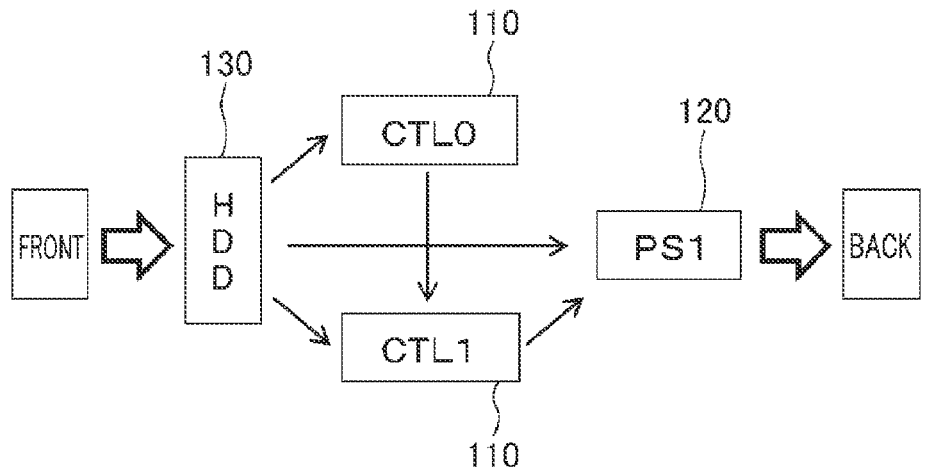
FIG. 18B is an explanatory diagram showing the cooling paths inside the storage apparatus 100 in the case where the one of the power supply modules 120 equipped with the cooling fans 122 is removed.

This embodiment employs a configuration as shown in FIGS. 18A and 18B in order to solve the above problem about cooling in the event of a loss of the function of one of the power supply modules 120. FIG. 18A is a schematic traverse cross-sectional view of the storage apparatus 100 corresponding to FIG. 17B. In FIG. 18A, the power supply module 120 in the left lower side of the storage apparatus 100 is for example removed due to some reason, and thereby the cooling function of the cooling fans 122 provided to this power supply module 120 is lost. The vent shutter ST provided at the vent V2-1 is blocking the flow of air between the housing space of the left upper storage control module 110 and that of the left lower power supply module 120. In this case, the cooling fans 122 of the still-running power supply module 120 housed in the right lower side of the storage apparatus 100 generates additionally a cooling airflow that passes through the left upper storage control module 110 via the vent V1 formed in the partitioning plate PT1. Accordingly, a necessary cooling airflow is supplied to the left upper storage control module 110 even after the loss of the cooling function of the left lower power supply module 120. In the event of a loss of the function of the power supply module PS0 as described above, a path is formed through which a cooling airflow (third airflow) flows by way of HDDs 130 in from side of storage apparatus 100--->storage control modules CTL0, CTL1--->power supply module PS1--->back of storage apparatus 100, as schematically shown in FIG. 18B.

Figure 19A:
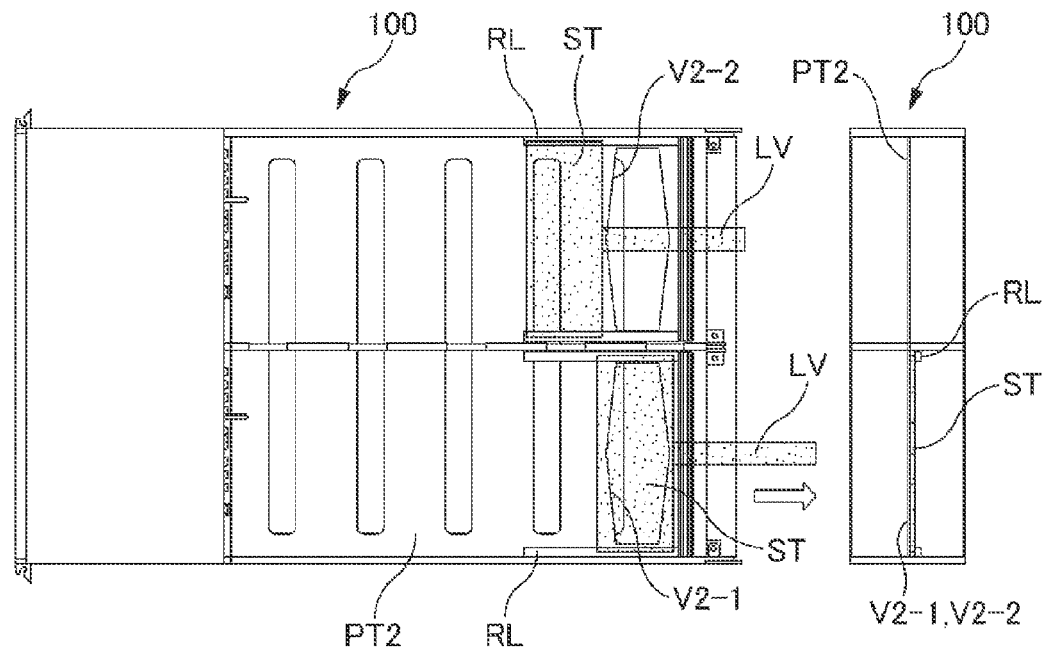
FIG. 19A is a schematic structure diagram of vent shutters ST provided to the chassis frame FR of the storage apparatus 100.
Figure 19B:
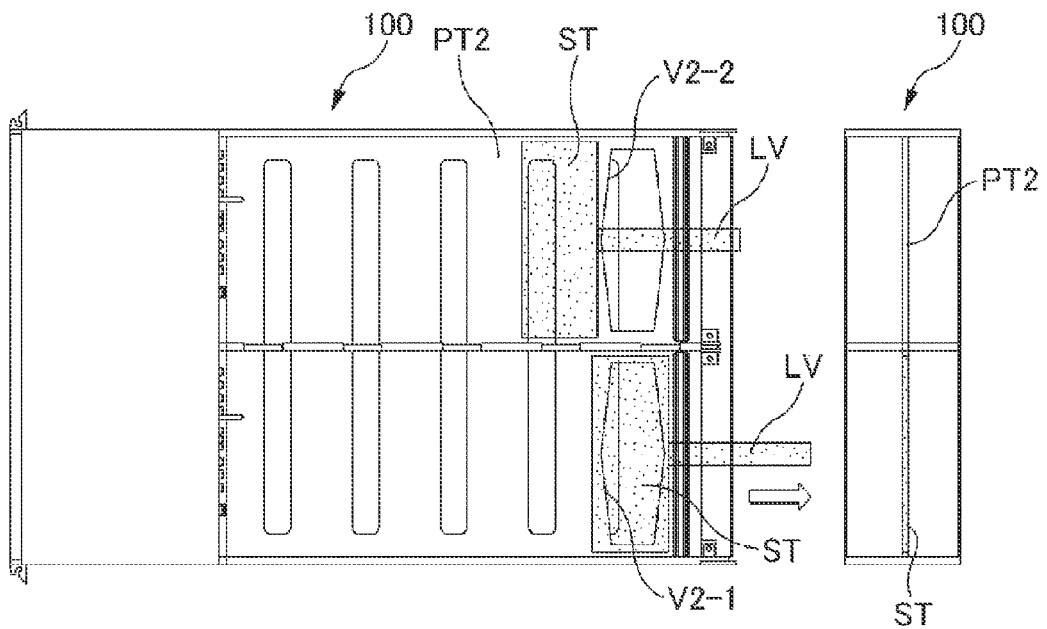
FIG. 19B is a schematic structure diagram of the vent shutters ST provided to the chassis frame FR of the storage apparatus 100.

Next, a specific configuration example will be described which allows the vents V2-1 and V2-2 provided in the chassis frame FR of the storage apparatus 100 to be opened and closed on the basis of the statuses of the power supply modules 120. FIGS. 19A and 19B show the configuration example which allows the opening and closing of the vents V2-1 and V2-2 in the chassis frame FR of the storage apparatus 100. Each of FIGS. 19A and 19B is a top view of the chassis frame FR with its top panel removed and a corresponding elevational view thereof. In the configuration example of FIG. 19A, two pairs of rails RL are provided on the lower surface of the partitioning plate PT2 of the chassis frame FR, and the vent shutters ST are fitted respectively to the pairs of rails RL in such a manner as to be movable along the rails RL. Through pushing and pulling operations of levers LV attached respectively to the vent shutters ST, the vent shutters ST can respectively and individually bring the vents V2-1 and V2-2 into open and closed states. For the vent shutters ST and the levers LV, suitable shapes, dimensions, and materials can be determined which consider the balance with their peripheral structural members but still enable proper opening and closing of the vents V2-1 and V2-2. For the rails RL, shapes, dimensions, materials, attachment positions, and attachment methods can be determined which are suitable for the opening and closing of the vents V2-1 and V2-2 by the vent shutters ST.

FIG. 19B is a configuration example in which the vent shutters ST are slidably attached to the partitioning plate PT2 of the chassis frame FR. The configuration in FIG. 19B uses a suitable structure to attach the vent shutters ST slidably to the partitioning plate PT2, and therefore does not include the rails RL.

Figure 20:
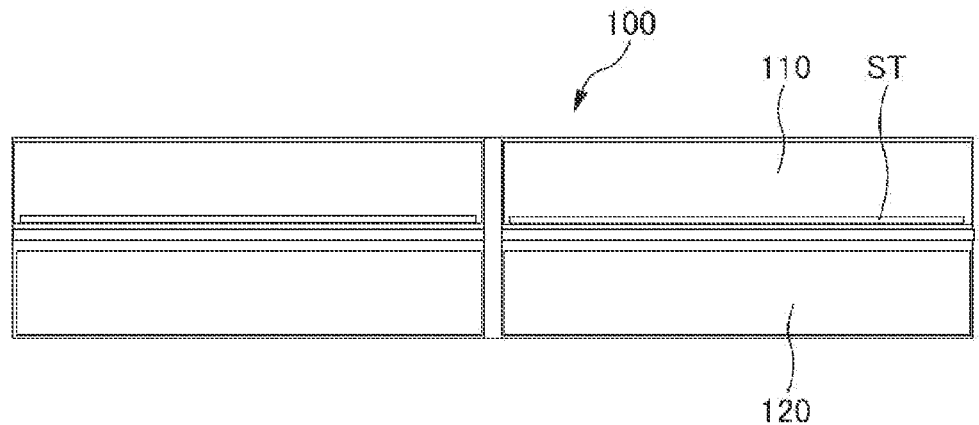
FIG. 20 is a schematic structure diagram of vent shutters ST provided to the storage control modules 110.
Figure 21:
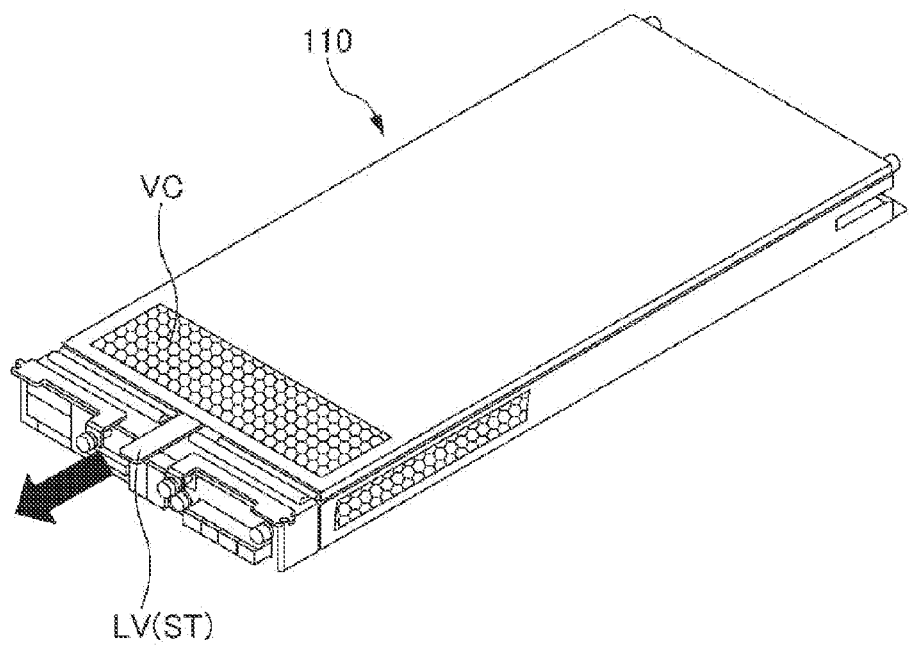
FIG. 21 is a schematic perspective view showing an example of the appearance of the storage control module 110 provided with the vent shutter ST.

Next, another configuration example related to the installation of the vent shutters ST will be described with reference to FIG. 20. FIG. 20 is a schematic elevational view of the storage apparatus 100 seen from the side at which the storage control modules 110 and the power supply modules 120 are housed. In each of the examples in FIGS. 19A and 19B, each vent shutter ST is attached to the chassis frame FR. In the example of FIG. 20, each vent shutter ST is incorporated in its corresponding storage control module 110 at the inner side of the lower surface thereof, as a configuration superior in cost to the configuration in which each vent shutter ST is incorporated in the chassis frame FR as a mechanism element. FIG. 21 shows a schematic perspective view of the storage control module 110 turned over and seen from the lower surface side thereof. The lower surface of the case of the storage control module 110 is provided with vent holes VC as punched holes in an area coinciding with the vents V2-1 and V2-2 provided in the partitioning plate PT2 of the chassis frame FR. Pushing and pulling operations of the lever LV slide the vent shutter ST along the inner side of the lower surface of the storage control module 110, thereby opening and closing the vent holes VC.

Figure 22A:
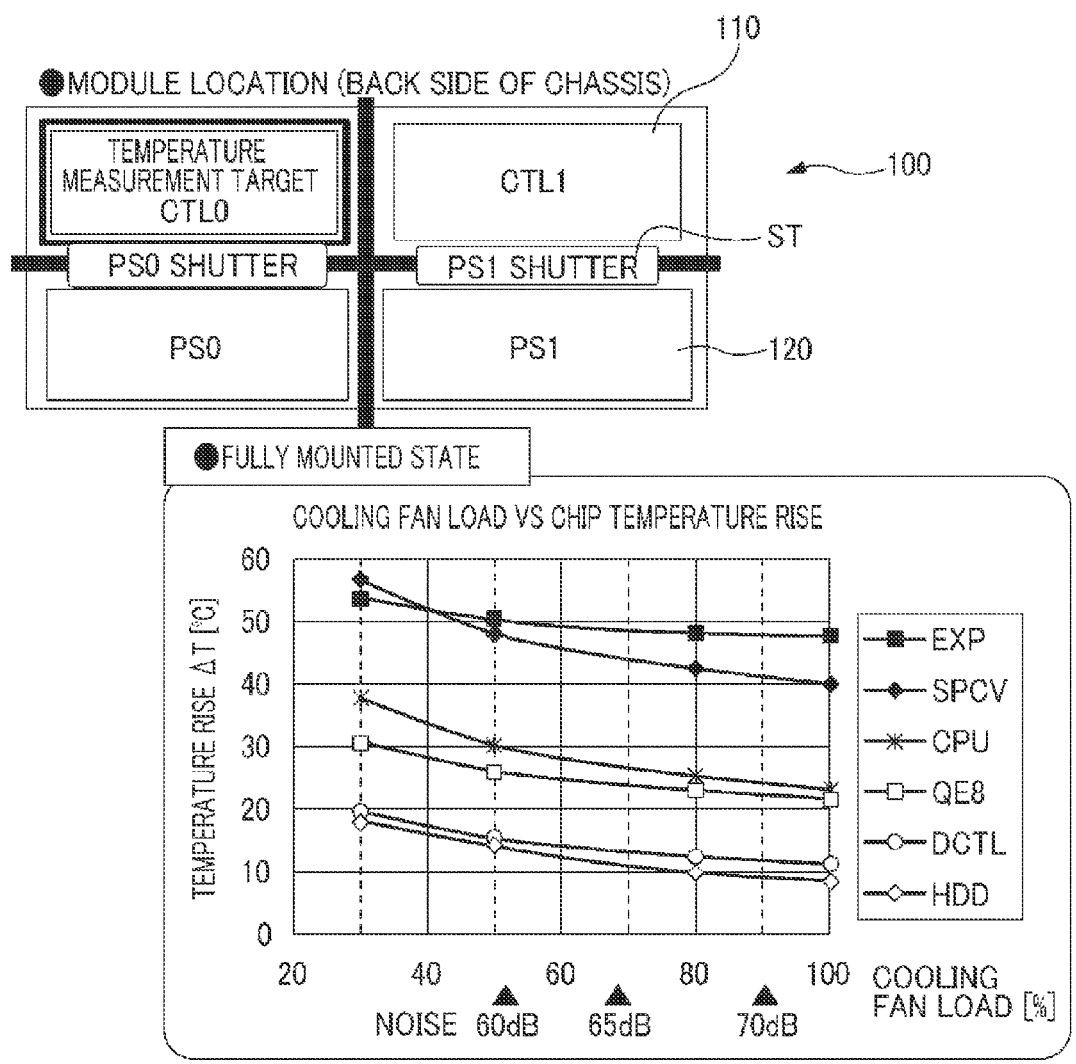
FIG. 22A is a diagram showing temperature changes in the storage apparatus 100 during a normal operation state.
Figure 22B:
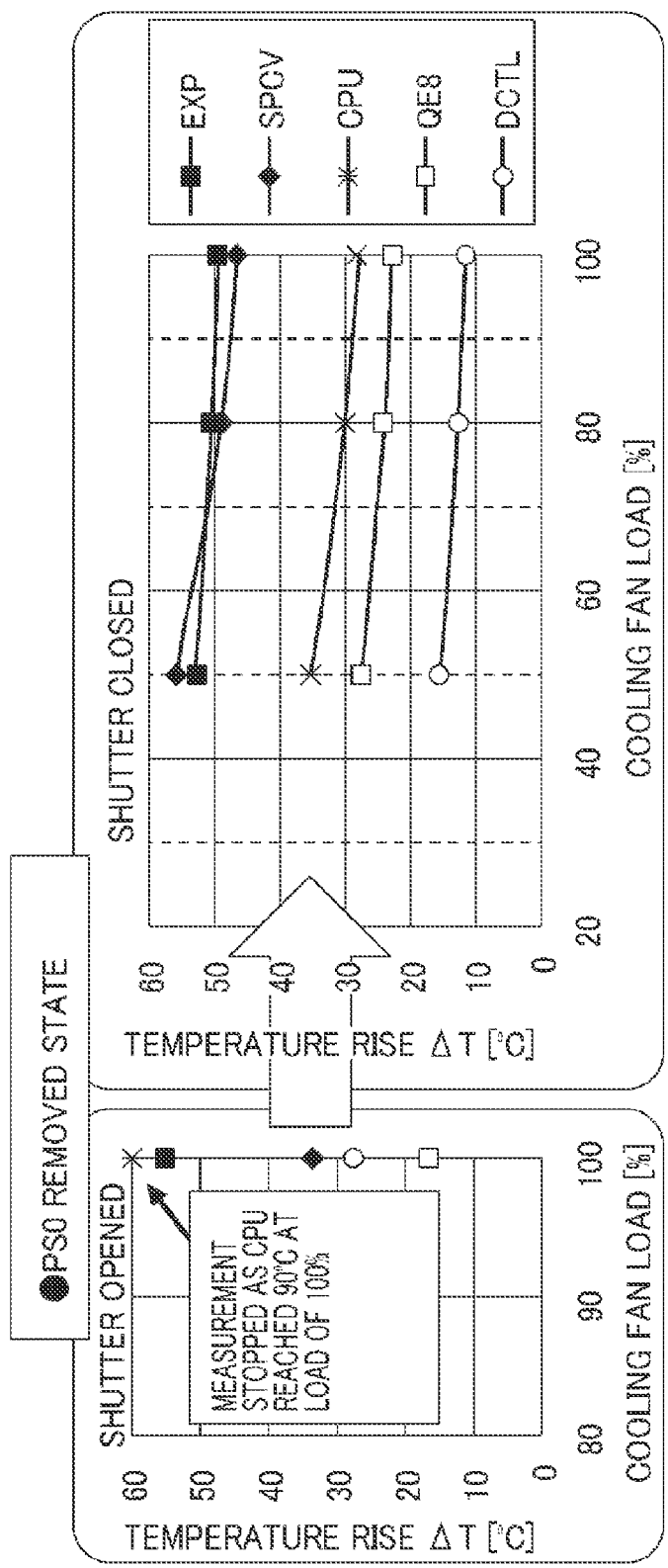
FIG. 22B is a diagram showing temperature changes in the storage apparatus 100 in a case where one of the power supply modules 120 is removed with its corresponding vent shutter ST opened and also in a case where the power supply module 120 is removed with the vent shutter ST closed.

FIGS. 22A and 22B illustrate cooling effects provided by the above-described cooling structure of the storage apparatus 100 of this embodiment. FIG. 22A shows measurement examples of the temperature rise of units in the storage apparatus 100 in a state where the two power supply modules 120 are running normally in the storage apparatus 100 and all the cooling fans 122 are generating cooling airflows. For example, in a case where the operation load on the cooling fans 122 is 100%, the temperature rise of the CPU 113 mounted in the storage control module 110 is approximately 22° C. On the other hand, in a case where the storage apparatus 100 is caused to continue running in a state where the power supply module PS0 is removed from the storage apparatus 100 without closing its vent shutter ST, the temperature of the CPU 113 exceeds 90° C. even when the operation load on the cooling fans 122 of the remaining power supply module PS1 is set at 100%, thereby making it impossible to maintain the operation of the storage apparatus 100. However, in a case where the vent shutter ST on the removed power supply module PS0 side is closed, the temperature rise of the CPU 113 is suppressed down to approximately 30° C., thereby making it possible to maintain the operation of the storage apparatus 100. As described above, with the cooling structure of this embodiment, it is possible to secure a cooling performance necessary for the storage apparatus 100 even with one of the power supply modules 120 removed.

Figure 23:
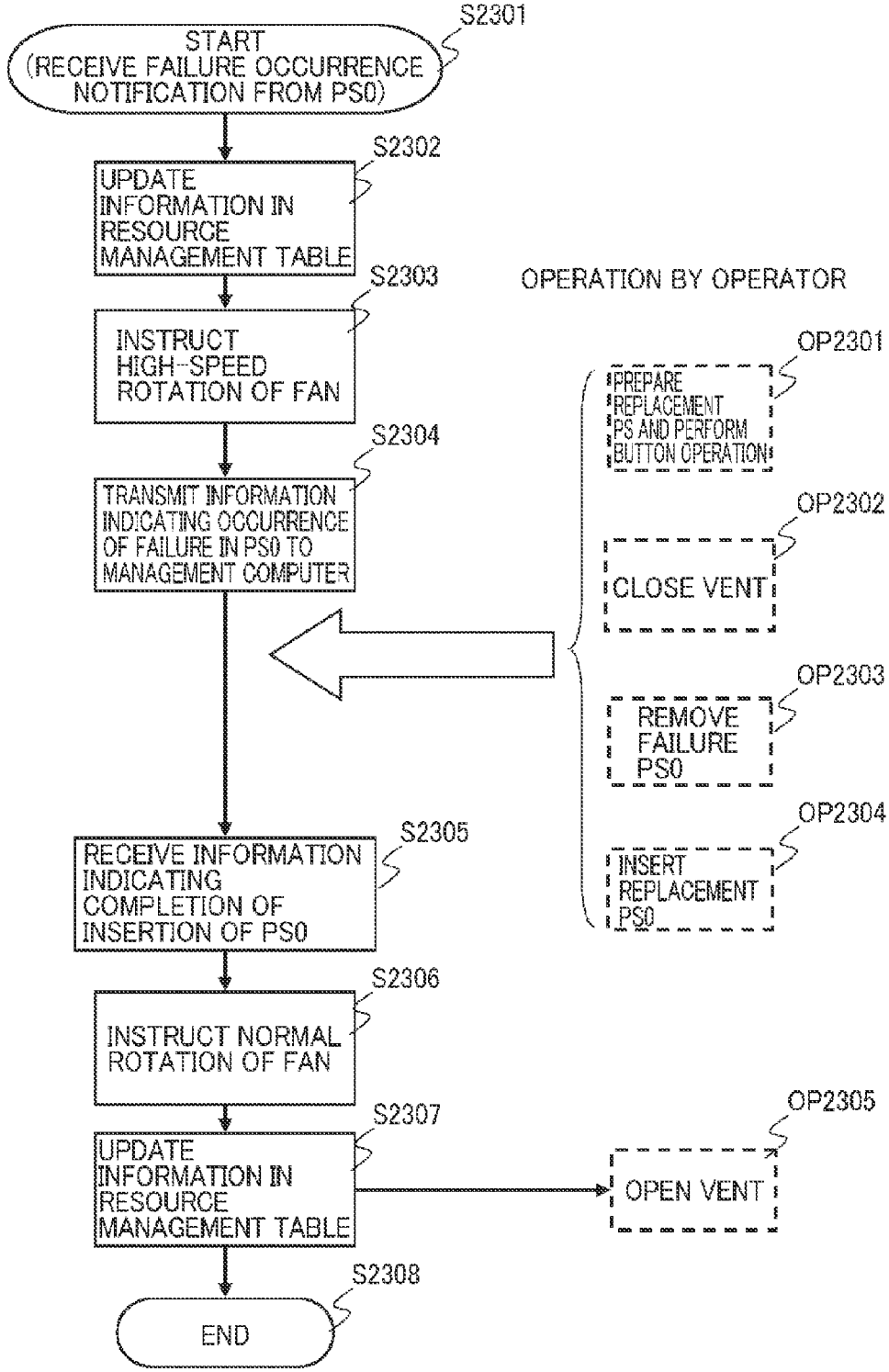
FIG. 23 is a diagram showing an example of the flow of processing which one of the storage control modules 110 performs in a case where a failure occurs in a corresponding one of the power supply modules 120 and the vent shutters ST are of a manual type.

Next, cooling control in the above-described storage apparatus 100 of this embodiment will be described. FIG. 23 shows an example of data processing which the storage control module CTL0 performs in a case where a failure occurs in the power supply module PS0 of the storage apparatus 100 and the power supply module PS0 needs to be replaced with a normal unit. In this case, until the removal of the power supply module PS0 and the replacement thereof with a normal unit are complete, the cooling capability originally covered by the cooling fans 122 of the power supply module PS0 cannot be regained. Accordingly, during the replacement of the power supply module PS0, the storage apparatus 100 has to rely on the cooling capability of the power supply module PS1 that remains running in the storage apparatus 100. Note that in the example of FIG. 23, the vent shutters ST provided to the chassis frame FR or to the storage control modules 110 are operated manually.

Figure 24:
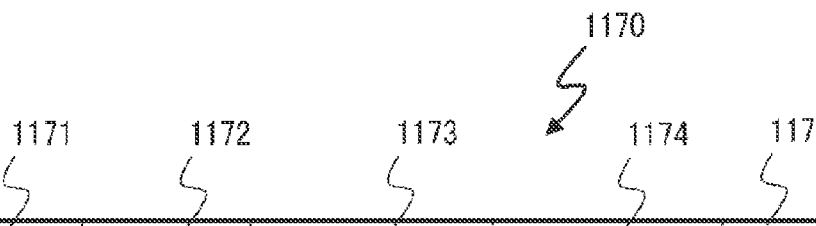
FIG. 24 is a diagram showing a configuration example of the resource management table 1170 in a case where a failure occurs in one of the power supply modules 120.

First, the resource manager 119 of the storage control module CTL0 detects a failure having occurred in the power supply module PS0. The resource manager 119 then transmits information of the failure in the power supply module PS0 to the data I/O control part 11120 of the storage control module CTL0 serving as the owner controller of the power supply module PS1. The discrimination between owner controllers is done by referring to the owner controller information 1174 recorded in the resource management table 1170. The data I/O control part 1120 updates the resource management table 1170 on the basis of the received information of the failure in the power supply module PS0 (S2301, S2302), FIG. 24 shows an example of the updated resource management table 1170. The configuration of the resource management table 1170 in FIG. 24 is the same as that of the example shown in FIG. 13, except that "FAILURE" indicating the occurrence of failure is recorded in the current status 1173 of the power unit 121 specified by PS0 in the location 1172. Moreover, to prepare for the removal of the power supply module PS0 having the failure, the data I/O control part 1120 records "high-speed rotation" in the item of the operation instruction 1175 of the cooling fans 112 specified by PS0 and PS1 in the location 1172 in the resource management table 1170. The resource manager 119 instructs the cooling fans 122 of the power supply modules PS0 and PS1 to perform high-speed rotation, on the basis of the contents of the updated resource management table 1170 (S2303). Here, the high-speed rotation instruction is given to the cooling fans 122 of the power supply module PS0 to be removed later, for the purpose of cooling its corresponding storage control module 110 as a preparation concerning a decrease in cooling capability to be caused by the removal of the power supply module PS0.

Figure 25A:
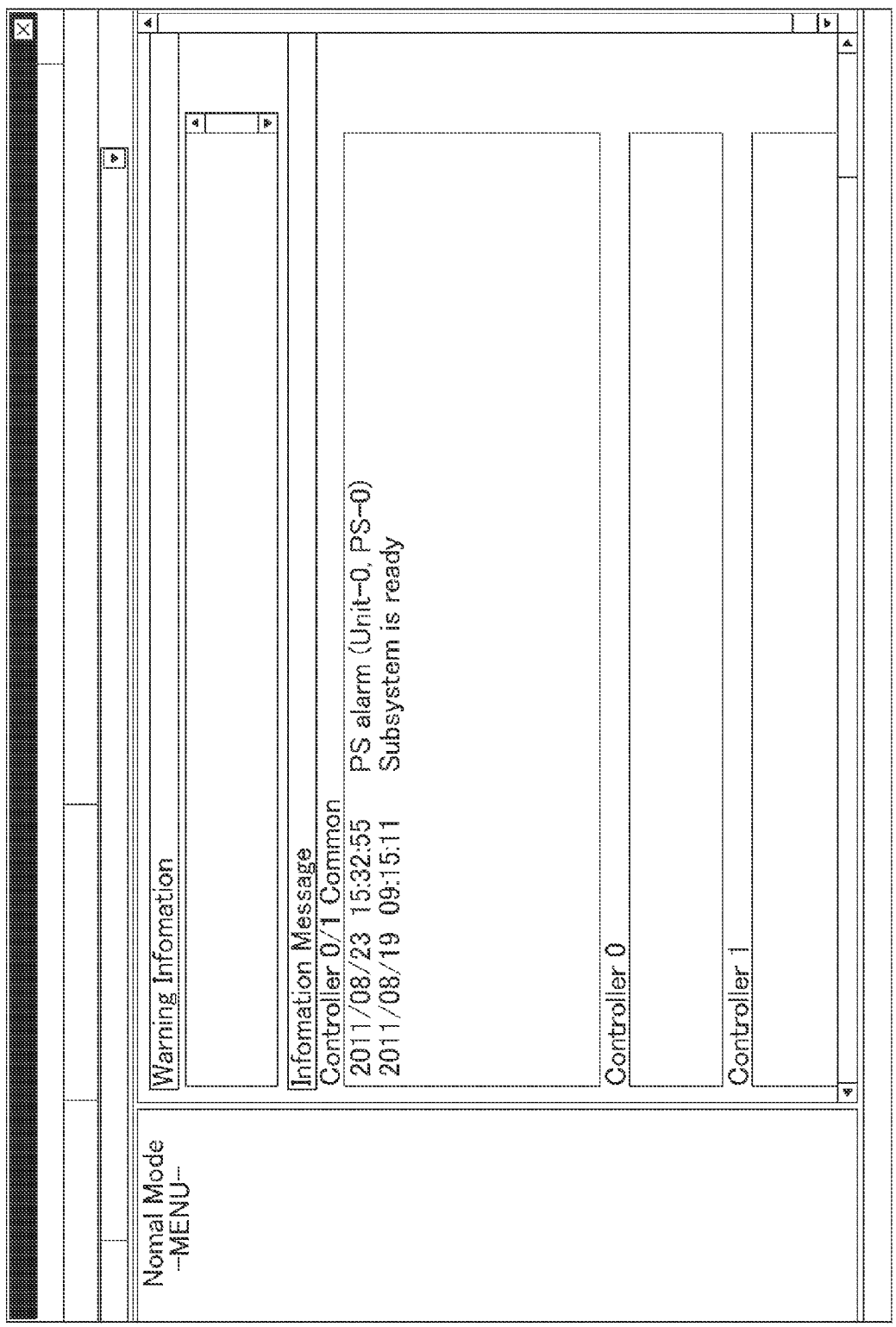
FIG. 25A is a diagram showing a screen example which is displayed on a management computer 400 in a case where a failure occurs in one of the power supply modules 120.
Figure 25B:
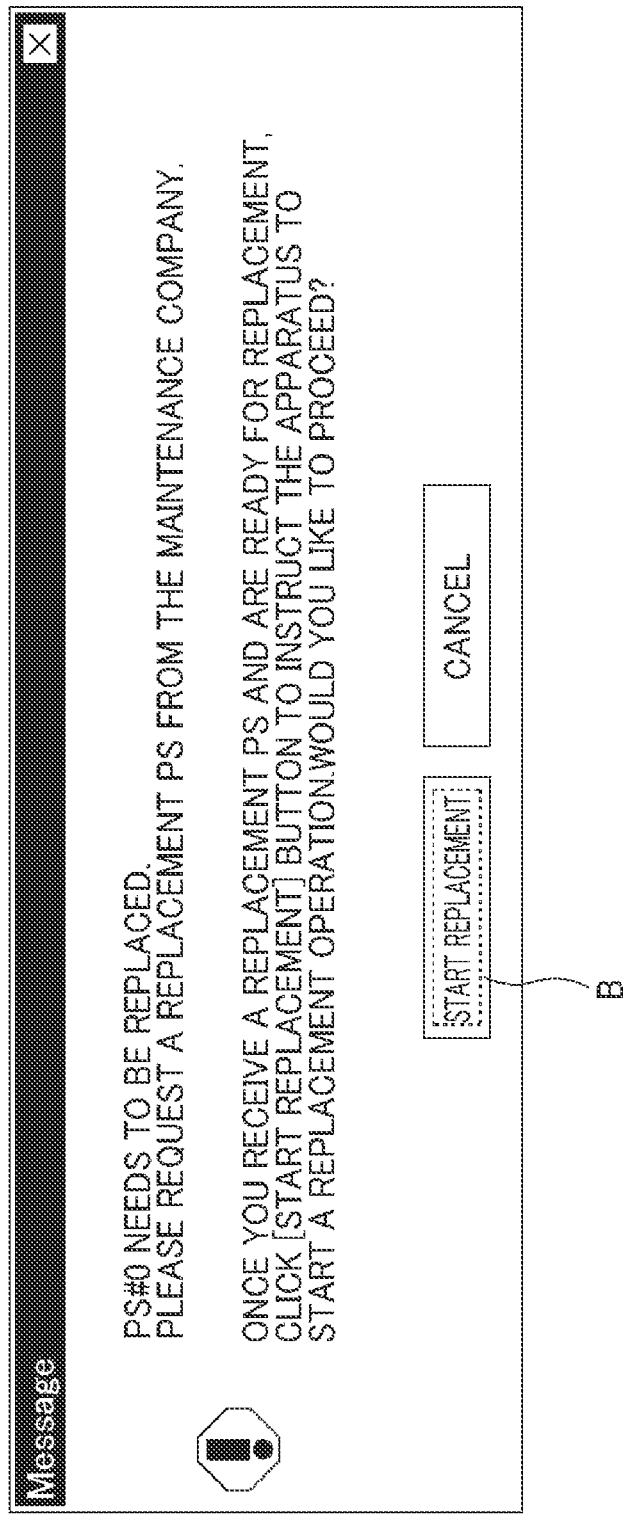
FIG. 25B is a diagram showing a screen example which is displayed on the management computer 400 in a case where a failure occurs in one of the power supply modules 120.

Then, the data I/O control part 1120 of the storage control module CTL0 transmits the information indicating the occurrence of the failure in the power supply module PS0 to the management computer 400 (S2304). The management computer 400 having received the information indicating the occurrence of the failure in the power supply module PS0 can output that information on its output device such as a monitor. FIG. 25A shows an example of a power supply module failure notification which can be outputted on the monitor of the management computer 400. FIG. 25A displays information indicating that a failure has occurred at 15:32:55 on Aug. 23, 2011 in the power supply module PS0 of the storage apparatus 100 specified by "Unit-0." FIG. 25B is a replacement instruction screen which can be outputted on the monitor of the management computer 400 over the screen in FIG. 25A or as a separate screen. In the screen example of FIG. 25B, displayed is a message prompting the replacement of the power supply module PS0. A replacement start button B provided in the screen example of FIG. 25B is a button for notifying the storage control module CTL0 managing the replacement target, or the power supply module PS0, of the start of the replacement of the power supply module PS0. By operating this button, an instruction to execute processing to shift the power supply systems to only the power supply module PS1 is issued to the resource manager 119 of the storage control module CTL0 from the management computer 400. For this power supply system shift processing, power supply system shift processing used in general storage systems can be employed, and thus detailed description thereof will be omitted. In this stage, the date I/O control part 1120 of the storage control module CTL0 remains standby until below-described replacement of the power supply module PS0 is complete.

The replacement of the power supply module PS0 having the failure is an offline operation which the operator performs manually after S2304. In the following, each step of this offline operation is denoted by a reference sign OP. First, the operator prepares a normal, replacement power supply module 120 (OP2301). Then, the operator manually closes the vent shutter ST provided on the operation target side of the storage apparatus 100, or the power supply module PS0 side (OP2302). Closing manually the vent shutter ST provided on the power supply module PS0 side forms a cooling airflow path leading from the storage control module CTL0 to the power supply module PS1 through the vents V1 and V2-2. Thus, the storage control module CTL0 remains cooled down by the cooling fans 122 of the power supply module PS1. The operation on the replacement start button B in the screen in FIG. 25B mentioned above can be performed in step OP2301, for example. Then, the operator removes the power supply module PS0 having the failure (OP2303), and mounts the replacement power supply module 120 in the storage apparatus 100 (OP2304). Opening the vent shutter ST provided on the power supply module PS0 side forms the normal, original cooling airflow path leading from the storage control module CTL0 to the power supply module PS0 through the vent V2-1. Thus, the storage control module CTL0 starts to be cooled down by the cooling fans 122 of the power supply module PS0.

The resource manager 119 of the storage control module CTL0 detects that the operator has mounted the replacement power supply module PS0 in OP2304. Such information is transmitted to the data I/O control part 1120 from the resource manager 119 and received by the data I/O control part 1120 (S2305). Then, the data I/O control part 1120 instructs the resource manager 119 to cause the cooling fans 122 of the power supply module PS0 to start normal rotation and also to cause the cooling fans 122 of the power supply module PS1 to put their operation statuses back to normal rotation (S2306). The data I/O control part 1120 then updates the information recorded in the resource management table 1170, and ends the processing (S2307, S2308). In this event, the contents of the resource management table 1170 are updated to the contents illustrated in FIG. 13. Lastly, the operator opens the vent shutter ST closed in OP2302 and ends the replacement operation (OP2305). By the above cooling control, the storage apparatus 100 of this embodiment can secure a cooling capability necessary for maintaining the operation of the storage apparatus 100 even when a failure occurs in one of the power supply modules 120.

Next, cooling control will be described which is executed in a case where one of the power supply modules 120 in operation is accidentally removed from the storage apparatus 100 of this embodiment having the above-described manual type vent shutters ST. FIG. 26 shows an example of data processing which the storage control module CTL0 performs in a case where the power supply module P50 of the storage apparatus 100 is removed accidentally. In this case too, the storage apparatus 100 has to rely on the cooling capability of the power supply module PS1 that remains running in the storage apparatus 100, until the removed power supply module 120 is put back or replaced with a new power supply module 120.

First, the resource manager 119 of the storage control module CTL0 detects the event, or the removal of the power supply module PS0. The resource manager 119 then transmits the information indicating the removal of the power supply module PS0 to the data I/O control part 1120 of the storage control module CTL0 serving as the owner controller of the power supply module PS0. The data I/O control part 1120 updates the resource management table 1170 on the basis of the received information indicating the removal of the power supply module PS0 (S2501, S2502). As in the case of a power supply failure, the resource management table 1170 in FIG. 24 records "FAILURE" indicating the occurrence of failure in the current status 1173 of the power unit 121 specified by PS0 in the location 1172. Then, the data I/O control part 1120 records "HIGH-SPEED ROTATION" in the item of the operation instruction 1175 of the cooling fans 122 specified by PS1 in the location 1172 in the resource management table 1170. The resource manager 119 instructs the cooling fans 122 of the power supply module PS1 to perform high-speed rotation, on the basis of the contents of the updated resource management table 1170 (S2503).

Then, the data I/O control part 1120 of the storage control module CTL0 transmits the information indicating the removal of the power supply module PS0 to the management computer 400 (S2504). The management computer 400 having received the information indicating the removal of the power supply module PS0 can output that information on its output device such as a monitor. It is possible to utilize the screens illustrated in FIGS. 25A and 25B to display the information indicating the removal of the power supply module PS0 and an instruction content prompting an operation in response thereto. In this stage, the data I/O control part 1120 of the storage control module CTL0 remains standby until below-described re-mount or replacement of the power supply module PS0 is complete.

The re-mount or replacement of the power supply module PS0 is an offline operation which the operator performs manually after S2504, and is executed by following steps OP2501 to OP2504 respectively corresponding to OP2301, OP2302, OP2304, and OP2305 in FIG. 23.

The resource manager 119 of the storage control module CTL0 detects that the operator has mounted a power supply module PS0 in OP2503. Such information is transmitted to the data I/O control part 1120 from the resource manager 119 and received by the data I/O control part 1120 (S2505). Then, the data I/O control part 1120 instructs the resource manager 119 to cause the cooling fans 122 of the power supply module PS0 to start normal rotation and also to cause the cooling fans 122 of the power supply module PS1 to put their operation statuses back to normal rotation (S2506). The data I/O control part 1120 then updates the information recorded in the resource management table 1170, and ends the processing (S2507, S2508). In this event, the contents of the resource management table 1170 are updated to the contents illustrated in FIG. 13. The operator then opens the vent shutter ST closed in OP2502 and ends the replacement operation (OP2504). By the above cooling control, the storage apparatus 100 of this embodiment can secure a cooling capability necessary for maintaining the operation of the storage apparatus 100 even when one of the power supply modules 120 is accidentally removed.

Figure 27:
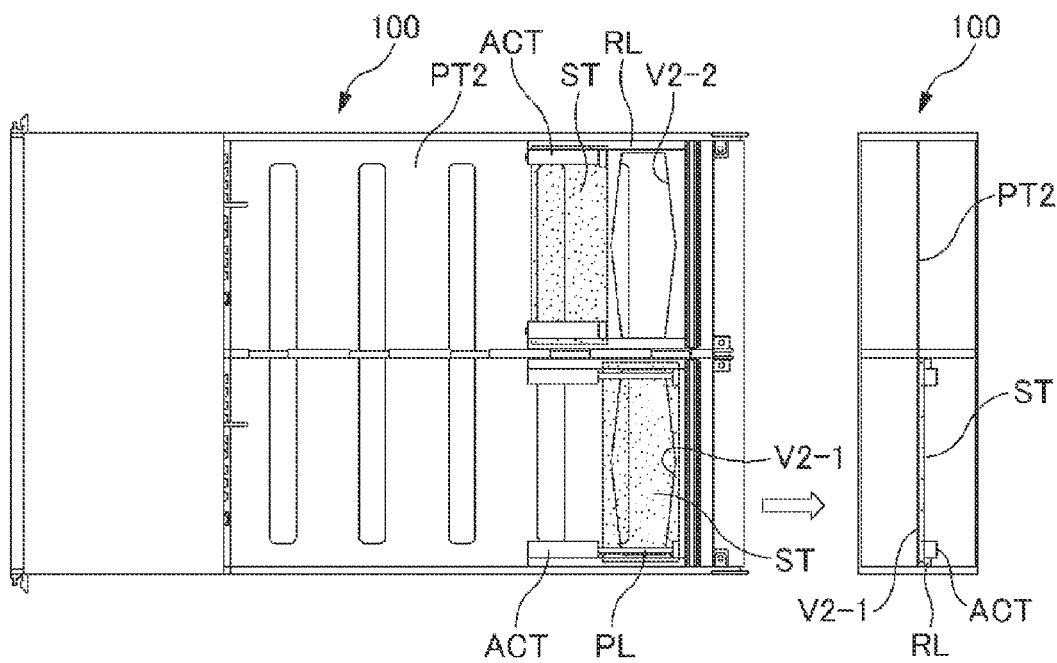
FIG. 27 is a schematic structure diagram of the chassis frame FR having automatic type vent shutters ST incorporated therein.

Next, a modification of the above-described cooling control in the storage apparatus 100 of this embodiment will be described. This modification differs from the above-described storage apparatus 100 in that the opening and closing of the vent shutters ST are controlled automatically by the storage control modules 110. FIG. 27 shows a schematic plan view of the storage apparatus 100 provided with automatically openable/closable vent shutters ST, and a corresponding elevational view thereof. FIG. 27 corresponds to the configuration in FIG. 19A and the partitioning plate PT2 of the chassis frame FR is provided with two pairs of actuators ACT for moving the vent shutters ST along the rails RL. An electromagnetic actuator using an electromagnetic coil can be employed as each of the actuators ACT, for example. However, any type of device is employable as long as it is suitable for moving the vent shutter ST. The driving of the actuators ACT is controlled by the storage control modules 110 recorded in the owner controller information 1144 in the vent shutter control management table 1140 in FIG. 12, Note that the actuators ACT can be applied to the case described with reference to FIGS. 20 and 21 where the vent shutter ST is provided to each storage control module 110. In that case, the actuators ACT are provided inside the case of the storage control module 1110.

Figure 28:
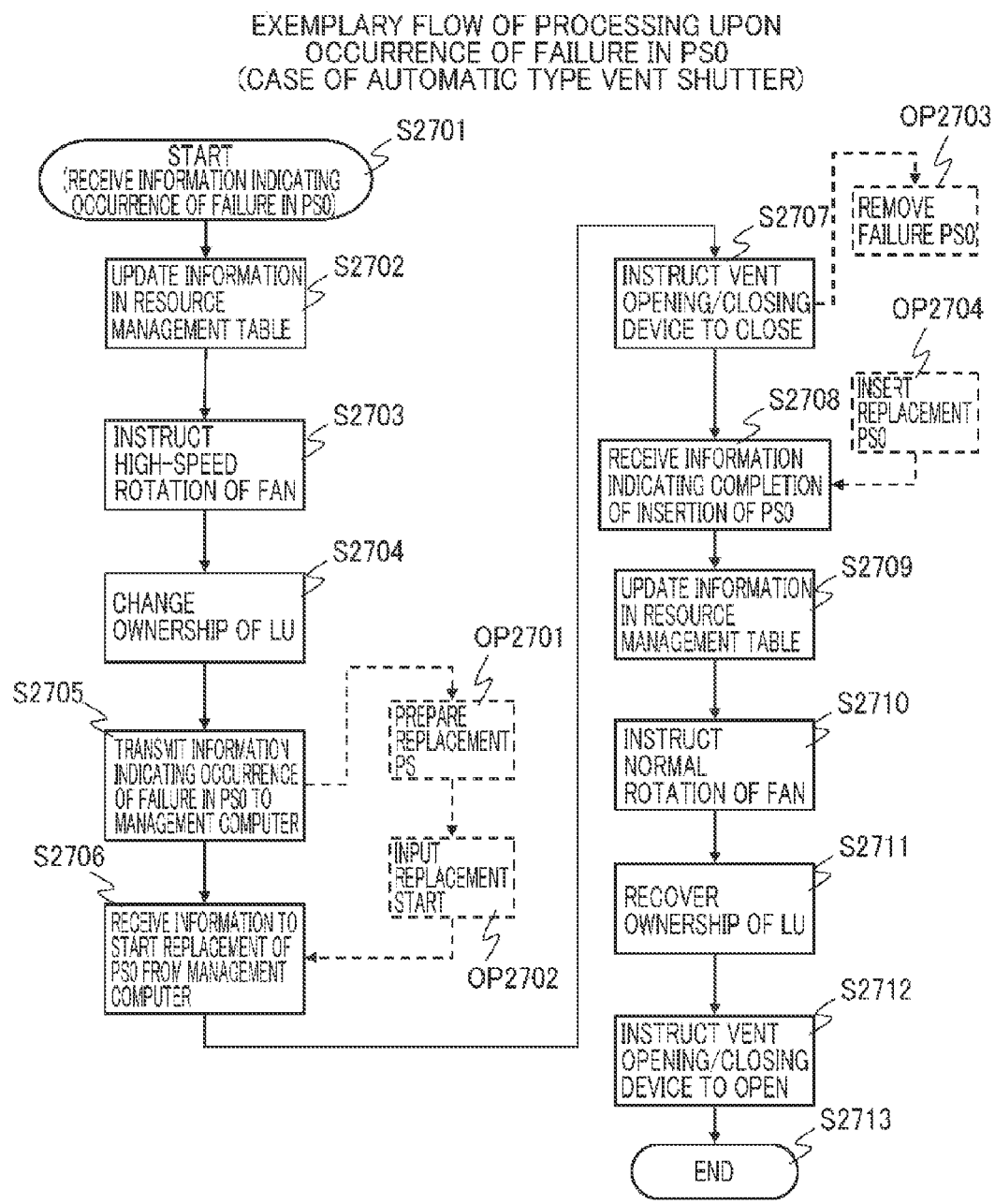
FIG. 28 is a diagram showing an example of the flow of processing which one of the storage control modules 110 performs in a case where a failure occurs in a corresponding one of the power supply modules 120 and the vent shutters ST are of an automatic type.

Next, cooling control will be described which is executed in the storage apparatus 100 of the above-described modification of this embodiment including the vent shutters ST equipped with an automatically opening/closing function. FIG. 28 shows an example of data processing which the storage control module CTL0 performs in a case where a failure occurs in the power supply module PS0 of the storage apparatus 100 and the power supply module PS0 needs to be replaced with a normal unit. FIG. 28 corresponds to the case of the manual type vent shutters ST illustrated in FIG. 23. Thus, the following description will mainly focus on a configuration and functions provided by the addition of the automatically opening/closing function. Meanwhile, the example of the processing in FIG. 28 uses processing which, upon occurrence of a failure in one of the power supply modules 120, changes the ownership of the logical volume assigned to the storage control module 110 which is cooled down by the one power supply module 120 during normal time. Note that this processing to change the ownership of the logical volume assigned to the storage control module 110 can also be used in the processing performed upon removal of one of the power supply modules 120, for both of the configuration requiring the manual opening and closing of the vent shutters and the configuration including the automatically opened/closed vent shutters.

First, the resource manager 119 of the storage control module CTL0 detects a failure having occurred in the power supply module PS0. Such information is received by the data I/O control part 1120 of the storage control module CTL0 serving as the owner controller of the power supply module PS0. The data I/O control part 1120 updates the resource management table 1170 on the basis of the received information of the failure in the power supply module PS0 (S2701, S2702). To prepare for the removal of the power supply module PS0 having the failure, the data. I/O control part 1120 records "HIGH-SPEED ROTATION" in the item of the operation instruction 1175 of the cooling fans 112 specified by P50 and PS1 in the location 1172 in the resource management table 1170. The resource manager 119 instructs the cooling fans 122 of the power supply modules PS0 and PS1 to perform high-speed rotation, on the basis of the contents of the updated resource management table 1170 (S2703).

Then, the data I/O control part 1120 of the storage control module CTL0 refers to the logical volume management table 1160 to acquire the logical volume number 1161 of the logical volume whose ownership during normal time is possessed by the storage control module CTL0, and then changes the ownership of the logical volume (S2704). In this way, in a case of receiving a data I/O processing request targeting the logical volume, processing is performed by which the ownership is interpreted such that the data I/O processing request should be handed over to the storage control module CTL1. The data I/O control part 1120 of the storage control module CTL0 then transmits the information indicating the occurrence of the failure in the power supply module PS0 to the management computer 400 (S2705). The management computer 400 having received the information indicating the occurrence of the failure in the power supply module PS0 can output that information on its output device such as a monitor, as described with reference to FIGS. 25A and 25B. In this stage, the data I/O control part 1120 of the storage control module CTL0 remains standby until below-described replacement of the power supply module PS0 is complete.

The replacement of the power supply module PS0 having the failure is an offline operation which the operator performs manually after S2705. First, the operator prepares a normal, replacement power supply module 120 (OP2701). Then, the operator operates the replacement start button B in the above-described screen in FIG. 25B to input information to start the replacement from the management computer 400 (OP2702). The storage control module CTL0 receives the information to start the replacement of the power supply module PS0 from the management computer 400 (S2706). Then, the storage control module CTL0 changes, to "closed," the shutter state 1145 of the vent shutter ST which is specified by 0 in the vent shutter ID 1141 and "B/W CLT0-PS0" in the vent location 1142 in the vent shutter control management table 1140, and transmits an instruction to the corresponding actuators ACT installed in the storage control module CTL0 to close the vent V2-1 (S2707). The actuators ACT close the vent V2-1 in accordance with this instruction from the storage control module CTL0. FIG. 29 shows an example of the vent shutter control management table 1140 after this event.

Thereafter, the operator checks whether the vent shutter ST on the storage control module CTL0 side is closed with his/her eyes or some other means, and then removes the power supply module PS0 having the failure (OP2703). The operator then mounts the replacement power supply module 120 (OP2704). The resource manager 119 of the storage control module CTL0 detects that the operator has mounted the replacement power supply module PS0 in OP2704, Such information is transmitted to the data I/O control part 1120 from the resource manager 119 and received by the data I/O control part 1120 (S2708). Then, the data I/O control part 1120 updates the information recorded in the resource management table 1170 to a state indicating that the power supply module PS0 is normal (S2709). Thereafter, the data I/O control part 1120 instructs the resource manager 119 to cause the cooling fans 122 of the power supply module PS0 to start normal rotation and also to cause the cooling fans 122 of the power supply module PS1 to put their operation statuses back to normal rotation (S2710). Moreover, the data I/O control part 1120 changes the ownership of the logical volume of the storage control module CTL0, which has been changed in S2704, to recover the ownership during normal time (S2711). Lastly, the storage control module CTL0 instructs the actuators ACT driving the vent shutter ST closing the vent V2-1 to open the vent shutter ST, and then ends the processing (S2712, S2713). By the above cooling control, the storage apparatus 100 of this embodiment can secure a cooling capability necessary for maintaining the operation of the storage apparatus 100 even when a failure occurs in one of the power supply modules 120. The storage apparatus 100 can also reduce the amount of work for the operations to manually open and close the vent shutter ST.

Figure 30:
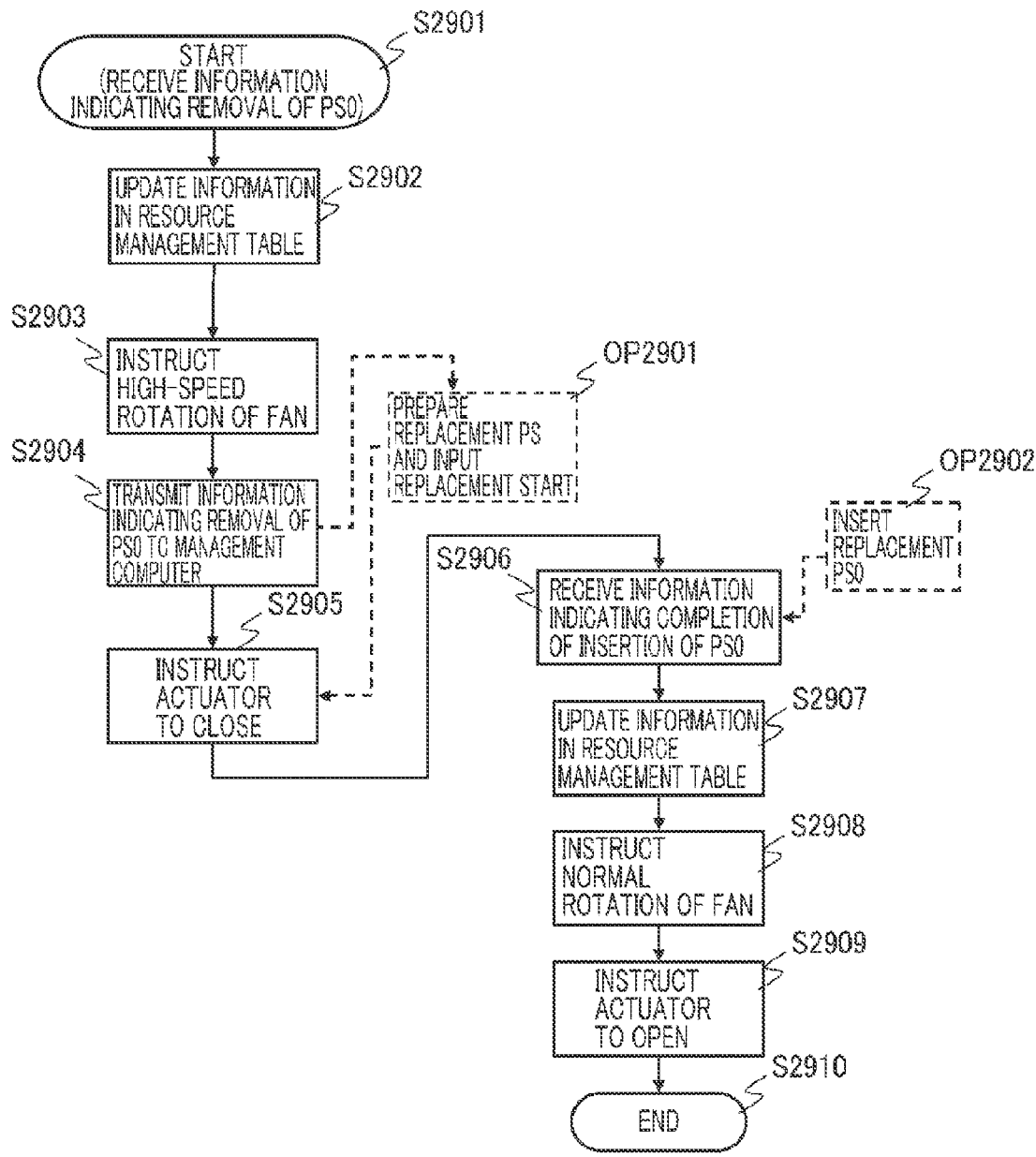
FIG. 30 is a diagram showing an example of the flow of processing which one of the storage control modules 110 performs in a case where a corresponding one of the power supply modules 120 is removed and the vent shutters ST are of an automatic type.

Next, cooling control will be described which is executed in the storage apparatus 100 of the modification including the vent shutters ST equipped with the automatically, opening/closing function in a case where one of the power supply modules 120 in operation is accidentally removed. FIG. 30 shows an example of data processing which the storage control module CTL0 performs in a case where the power supply module PS0 of the storage apparatus 100 is accidentally removed. The processing flow example of FIG. 30 corresponds to the processing flow example with the manual type vent shutters ST shown in FIG. 26. Thus, the difference from the case of FIG. 26 will be mainly described.

First, the resource manager 119 of the storage control module CTL0 detects the event, or the removal of the power supply module PS0. The resource manager 119 then transmits the information of the removal of the power supply module CTL0 to the data I/O control part 1120 of the storage control module CTL0 serving as the owner controller of the power supply module PS0. The data I/O control part 1120 updates the resource management table 1170 on the basis of the received information indicating the removal of the power supply module PS0 (S2901, S2902). As in the case of a failure occurrence, the resource management table 1170 in FIG. 24 records "FAILURE" in the current status 1173 of the power unit 121 specified by PS0 in the location 1172. Then, the data I/O control part 1120 records "HIGH-SPEED ROTATION" in the item of the operation instruction 1175 of the cooling fans 1122 specified by PS1 in the location 1172 in the resource management table 1170. The resource manager 119 instructs the cooling fans 122 of the power supply module PS1 to perform high-speed rotation, on the basis of the contents of the updated resource management table 1170 (S2903).

Then, the data I/O control part 1120 of the storage control module CTL0 transmits the information indicating the removal of the power supply module PS0 to the management computer 400 (S2904). The management computer 400 having received the information indicating the removal of the power supply module PS0 can output that information on its output device such as a monitor. It is possible to utilize the screens illustrated in FIGS. 25A and 25B to display the information indicating the removal of the power supply module PS0 and an instruction content prompting an operation in response thereto. In this stage, the data I/O control part 1120 of the storage control module CTL0 remains standby until below-described re-mount or replacement of the power supply module PS0 is complete.

The operator re-mounts the removed power supply module PS0 or prepares a replacement power supply module 120, and operates the replacement start button B in the above-described screen in FIG. 25B to input information to start the replacement from the management computer 400 (OP2901).

The storage control module CTL0 receives the information to start the replacement of the power supply module PS0 from the management computer 400, Then, the storage control module CTL0 changes, to "closed," the shutter state 1145 of the vent shutter ST which is specified by 0 in the vent shutter ID 1141 and "B/W CLT0-PS0" in the vent location 1142 in the vent shutter control management table 1140, and transmits an instruction to the corresponding actuators ACT installed in the storage control module CTL0 to close the vent V2-1 (S2905). The actuators ACT close the vent V2-1 in accordance with this instruction from the storage control module CTL0.

Thereafter, the operator checks whether the vent shutter ST on the storage control module CTL0 side is closed with his/her eyes or some other means, and then mounts the power supply module 120 (OP2902). The resource manager 119 of the storage control module CTL0 detects that the operator has mounted the power supply module PS0. Such information is transmitted to the data I/O control part 1120 from the resource manager 119 and received by the data I/O control part 1120 (S2906). Then, the data I/O control part 1120 updates the information recorded in the resource management table 1170 to a state indicating that the power supply module PS0 is normal (S2907). Thereafter, the data I/O control part 1120 instructs the resource manager 119 to cause the cooling fans 1'22 of the power supply module PS0 to start normal rotation and also to cause the cooling fans 122 of the power supply module PS1 to put their operation statuses back to normal rotation (S2908). Lastly, the storage control module CTL0 instructs the actuators ACT driving the vent shutter ST closing the vent V2-1 to open the vent shutter ST, and then ends the processing (S2909, S2910). By the above cooling control, the storage apparatus 100 of this embodiment can secure a cooling capability necessary for maintaining the operation of the storage apparatus 100 and also can reduce the amount of work for the operations to manually open and close the vent shutter ST, as in the case where a failure occurs in one of the power supply modules 120.

As we described hereinabove in detail the cooling structures and the cooling controls of the storage apparatus through an embodiment of this invention, this invention can provide a storage apparatus and a method of cooling a storage apparatus in and by which a cooling capacity necessary for the storage apparatus can be secured even when part of cooling fans provided to the storage apparatus fails to function normally, by using the other part of the cooling fans.

Note that although the invention of this application has been described based on embodiments with reference to the accompanying drawings, the invention of this application is not limited to the embodiments. Moreover, all modifications and equivalents which do not depart from the gist of the invention of this application fall within the scope of the invention of this application.

The invention claimed is:

1. A storage apparatus for providing a logical storage area as a data storage area to an external apparatus, comprising:
    a physical storage medium for creating the logical storage area;
    first and second storage control modules each of which is communicatively coupled to the physical storage medium to control data input/output processing between the external apparatus and the logical storage area; and
    first and second power supply modules each of which supplies power to the physical storage medium and the first and second storage control modules and includes a blower for generating a cooling airflow to cool down the physical storage medium and the first and second storage control modules, wherein
    the blower of the first power supply module generates a first cooling airflow which flows through the physical storage medium, the first storage control module, and the first power supply module,
    the blower of the second power supply module generates a second cooling airflow which flows through the physical storage medium, the second storage control module, and the second power supply module, and
    in a case where the first power supply module is removed from the storage apparatus, the blower of the second power supply module generates a third cooling airflow which flows through the physical storage medium, the first storage control module, and the second power supply module as a replacement for the first cooling airflow,
    wherein:
    a first vent is provided on a first partitioning plate between the first storage control module and the second storage control module,
    a second vent is provided on a second partitioning plate between the first storage control module and the first power supply module, wherein the second vent is provided with a shutter for opening and closing the second vent,
    a third vent is provided on a third partitioning plate between the second storage control module and the second power supply module, and
    the path of the first cooling airflow changes to the path of the third cooling airflow by closing the second vent by the shutter.

2. The storage apparatus according to claim 1, wherein in a case where any one of the first storage control module and the second storage control module receives information indicating that the first power supply module is removed, the shutter closes in response to an instruction from the any one of the first storage control module and the second storage control module.

3. The storage apparatus according to claim 1, wherein in a case where the first power supply module is removed, any one of the first storage control module and the second storage control module increases at least a cooling air volume generated by the blower of the second power supply module to a volume greater than that during normal time.

4. The storage apparatus according to claim 1, wherein in a case where the first power supply module is removed, the storage control module managing the first power supply module that is one of the first storage control module and the second storage control module makes a change such that the second storage control module performs data input/output processing for the logical storage area where the first storage control module has been so far responsible for data input/output processing.

5. The storage apparatus according to claim 1, wherein in a case where a failure occurs in any one of the first storage control module and the second storage control module, the first or second storage control module to which a failure does not occur makes a change such that the other one of the storage control modules manages one of the first power supply module and the second power supply module having been so far managed by the storage control module having the failure.

6. The storage apparatus according to claim 1, wherein in a case where any one of the first storage control module and the second storage control module detects occurrence of a failure in the first power supply module, the any one of the first storage control module and the second storage control module outputs information indicating that the first power supply module needs to be removed.

7. A method of cooling a storage apparatus including, for providing a logical storage area as a data storage area to an external apparatus,
    a physical storage medium for creating the logical storage area,
    first and second storage control modules each of which is communicatively coupled to the physical storage medium to control data input/output processing between the external apparatus and the logical storage area, and
    first and second power supply modules each of which supplies power to the physical storage medium and the first and second storage control modules and includes a blower for generating a cooling airflow to cool down the physical storage medium and the first and second storage control modules,
the method comprising:
    causing the blower of the first power supply module to generate a first cooling airflow which flows through the physical storage medium, the first storage control module, and the first power supply module;
    causing the blower of the second power supply module to generate a second cooling airflow which flows through the physical storage medium, the second storage control module, and the second power supply module; and
    in a case where the first power supply module is removed from the storage apparatus, causing the blower of the second power supply module to generate a third cooling airflow which flows through the physical storage medium, the first storage control module, and the second power supply module as a replacement for the first cooling airflow,
wherein:
a first vent is provided on a first partitioning plate between the first storage control module and the second storage control module,
a second vent is provided on a second partitioning plate between the first storage control module and the first power supply module, wherein the second vent is provided with a shutter for opening and closing the second vent,
a third vent is provided on a third partitioning plate between the second storage control module and the second power supply module, and
the path of the first cooling airflow changes to the path of the third cooling airflow by closing the second vent by the shutter.

8. The method of cooling the storage apparatus according to claim 7,
wherein in a case where any one of the first storage control module and the second storage control module receives information indicating that the first power supply module is removed, the shutter closes in response to an instruction from the any one of the first storage control module and the second storage control module.

9. The method of cooling the storage apparatus according to claim 7,
wherein in a case where the first power supply module is removed, any one of the first storage control module and the second storage control module increases at least a cooling air volume generated by the blower of the second power supply module to a volume greater than that during normal time.

10. The method of cooling the storage apparatus according to claim 7,
wherein in a case where the first power supply module is removed, the storage control module managing the first power supply module that is one of the first storage control module and the second storage control module makes a change such that the second storage control module performs data input/output processing for the logical storage area where the first storage control module has been so far responsible for data input/output processing.

11. The method of cooling the storage apparatus according to claim 7,
wherein in a case where a failure occurs in any one of the first storage control module and the second storage control module, the first or second storage control module to which a failure does not occur makes a change such that the other one of the storage control modules manages one of the first power supply module and the second power supply module having been so far managed by the storage control module having the failure.

* * * * *